US008563212B2

(12) United States Patent
Bowles et al.

(10) Patent No.: US 8,563,212 B2
(45) Date of Patent: Oct. 22, 2013

(54) METHODS FOR PRODUCING PHOTOSENSITIVE MICROPARTICLES, NON-AQUEOUS DISPERSIONS THEREOF AND ARTICLES PREPARED THEREWITH

(75) Inventors: Steven E. Bowles, Pittsburgh, PA (US); Anu Chopra, Pittsburgh, PA (US); James P. Colton, Trafford, PA (US); Dennis L. Faler, North Huntingdon, PA (US); M. Frank Haley, Glenshaw, PA (US); Paul H. Lamers, Allison Park, PA (US); Yunyi Lu, Monroeville, PA (US); Kevin J. Stewart, Murrysville, PA (US); Cathy A. Taylor, Allison Park, PA (US); Feng Wang, Export, PA (US); Elizabeth A. Zezinka, Cranberry Township, PA (US)

(73) Assignee: Transitions Optical, Inc., Pinellas Park, FL (US)

( * ) Notice: Subject to any disclaimer, the term of this patent is extended or adjusted under 35 U.S.C. 154(b) by 348 days.

(21) Appl. No.: 12/719,293

(22) Filed: Mar. 8, 2010

(65) Prior Publication Data
US 2010/0209697 A1 Aug. 19, 2010

Related U.S. Application Data

(63) Continuation-in-part of application No. 10/892,919, filed on Jul. 16, 2004, now Pat. No. 8,153,344.

(51) Int. Cl.
*G03C 1/72* (2006.01)
*G03F 7/00* (2006.01)

(52) U.S. Cl.
CPC ..................................... *G03F 7/002* (2013.01)
USPC .................... 430/138; 430/270.1; 252/586

(58) Field of Classification Search
CPC .................. G03C 1/72; G03C 7/002
USPC ................ 430/138, 270.1; 252/586
See application file for complete search history.

(56) References Cited

U.S. PATENT DOCUMENTS

| | | |
|---|---|---|
| 108,935 A | 11/1870 | Rich |
| 108,936 A | 11/1870 | Rich |
| 4,046,729 A | 9/1977 | Scriven et al. |
| 4,358,388 A | 11/1982 | Daniel et al. |
| 4,533,254 A | 8/1985 | Cook et al. |
| 4,546,045 A | 10/1985 | Elias |
| 4,556,605 A | 12/1985 | Mogami et al. |
| 4,681,811 A | 7/1987 | Simpson et al. |
| 4,685,783 A | 8/1987 | Heller et al. |
| 4,732,790 A | 3/1988 | Blackburn et al. |
| 4,798,746 A | 1/1989 | Claar et al. |
| 4,929,693 A | 5/1990 | Akashi et al. |
| 4,931,220 A | 6/1990 | Haynes et al. |
| 4,963,461 A | 10/1990 | Takahashi et al. |
| 5,061,602 A | 10/1991 | Koch et al. |
| 5,071,904 A | 12/1991 | Martin et al. |
| 5,134,053 A | 7/1992 | Mueller-hess et al. |
| 5,143,997 A | 9/1992 | Endo et al. |
| 5,166,345 A * | 11/1992 | Akashi et al. ................... 544/71 |
| 5,246,748 A | 9/1993 | Gillberg-Laforce et al. |
| 5,252,450 A | 10/1993 | Schwerzel et al. |
| 5,356,713 A | 10/1994 | Charmot et al. |
| 5,458,814 A | 10/1995 | Kumar et al. |
| 5,468,802 A | 11/1995 | Wilt et al. |
| 5,527,879 A | 6/1996 | Nakae et al. |
| 5,631,382 A | 5/1997 | Tanizawa et al. |
| 5,639,802 A | 6/1997 | Neckers et al. |
| 5,645,767 A | 7/1997 | Van Gemert |
| 5,658,501 A | 8/1997 | Kumar et al. |
| 5,698,141 A | 12/1997 | Kumar |
| 5,723,072 A | 3/1998 | Kumar |
| 5,919,846 A | 7/1999 | Batlaw et al. |
| 5,952,131 A | 9/1999 | Kumacheva et al. |
| 6,022,497 A | 2/2000 | Kumar |
| 6,025,026 A | 2/2000 | Smith et al. |
| 6,060,001 A | 5/2000 | Welch et al. |
| 6,080,338 A | 6/2000 | Kumar |
| 6,113,814 A | 9/2000 | Van Gemert et al. |
| 6,136,968 A | 10/2000 | Chamontin et al. |
| 6,150,430 A | 11/2000 | Walters et al. |

(Continued)

FOREIGN PATENT DOCUMENTS

| | | |
|---|---|---|
| EP | 0277639 A2 | 2/1988 |
| JP | 64-29489 | 1/1989 |

(Continued)

OTHER PUBLICATIONS

"Catalysts and Additives (Polyurethanes)," *Ullman's Encyclopedia of Industrial Chemistry*, Completely Revised Fifth Edition, vol. A21, pp. 673-674, Section 3.5 (1992).

Haugland, R.P., *Molecular Probes Handbook for Fluorescent Probes and Research Chemicals*, Sixth Edition, 1996.

D. Arivuoli "Fundamentals of Nonlinear Optical Materials" PRAMANA—Journal of Physics vol. 57, Nos. 5&6, Nov. & Dec. 2001, pp. 871-883.

(Continued)

*Primary Examiner* — John Chu
(74) *Attorney, Agent, or Firm* — Deborah M. Altman

(57) ABSTRACT

Described are non-aqueous dispersions of photosensitive polymeric microparticles, comprising: a) an organic continuous phase comprising an organic solvent; and b) photosensitive polymeric microparticles dispersed in the organic continuous phase. The microparticles comprise an at least partially polymerized component having integral surface and interior domains, wherein the surface domain comprises a polymeric material that is solubilized by the organic solvent, the interior domain comprises a polymeric material that is insoluble in the organic solvent, and the surface domain and/or interior domain is photosensitive. Also described are methods of producing such non-aqueous dispersions, curable film-forming compositions containing them, and photosensitive coated substrates.

14 Claims, No Drawings

(56) References Cited

U.S. PATENT DOCUMENTS

| | | |
|---|---|---|
| 6,153,126 A | 11/2000 | Kumar |
| 6,180,181 B1 | 1/2001 | Verardi et al. |
| 6,187,444 B1 | 2/2001 | Bowles, III et al. |
| 6,214,500 B1 | 4/2001 | Kumacheva et al. |
| 6,268,055 B1 | 7/2001 | Walters et al. |
| 6,281,272 B1 | 8/2001 | Baldy et al. |
| 6,291,564 B1 | 9/2001 | Faler et al. |
| 6,296,785 B1 | 10/2001 | Nelson et al. |
| 6,325,957 B1 | 12/2001 | Kumacheva et al. |
| 6,329,060 B1 | 12/2001 | Barkac et al. |
| 6,337,131 B1 | 1/2002 | Rupaner et al. |
| 6,338,808 B1 | 1/2002 | Kawata et al. |
| 6,348,604 B1 | 2/2002 | Nelson et al. |
| 6,353,102 B1 | 3/2002 | Kumar |
| 6,432,544 B1 | 8/2002 | Stewart et al. |
| 6,433,043 B1 | 8/2002 | Misura et al. |
| 6,436,525 B1 | 8/2002 | Welch et al. |
| 6,506,488 B1 | 1/2003 | Stewart et al. |
| 6,525,136 B1 | 2/2003 | Foucher et al. |
| 6,531,076 B2 | 3/2003 | Crano et al. |
| 6,555,028 B2 | 4/2003 | Walters et al. |
| 6,599,973 B1 | 7/2003 | Visscher et al. |
| 6,602,603 B2 | 8/2003 | Welch et al. |
| 6,607,994 B2 | 8/2003 | Soane et al. |
| 6,630,597 B1 | 10/2003 | Lin et al. |
| 6,641,874 B2 | 11/2003 | Kuntz et al. |
| 6,645,767 B1 | 11/2003 | Villa et al. |
| 6,687,266 B1 | 2/2004 | Ma et al. |
| 6,713,536 B2 | 3/2004 | Misura et al. |
| 6,733,887 B2 | 5/2004 | Okoroafor et al. |
| 6,749,779 B2 | 6/2004 | Soane et al. |
| 6,770,710 B2 | 8/2004 | Robert et al. |
| 6,875,483 B2 | 4/2005 | Ichihashi et al. |
| 6,998,072 B2 | 2/2006 | Welch et al. |
| 7,097,303 B2 | 8/2006 | Kumar et al. |
| 7,186,359 B2 | 3/2007 | Maisonnier et al. |
| 7,256,921 B2 | 8/2007 | Kumar et al. |
| 7,342,112 B2 | 3/2008 | Kumar et al. |
| 7,438,972 B2 | 10/2008 | Faler et al. |
| 7,452,611 B2 | 11/2008 | Blackburn et al. |
| 7,632,540 B2 | 12/2009 | Kumar et al. |
| 2003/0086978 A1 | 5/2003 | Kim et al. |
| 2003/0141490 A1 | 7/2003 | Walters et al. |
| 2003/0174560 A1 | 9/2003 | Dahmen et al. |
| 2005/0287354 A1 | 12/2005 | Jennings et al. |
| 2008/0026217 A1 | 1/2008 | Kim et al. |

FOREIGN PATENT DOCUMENTS

| | | |
|---|---|---|
| JP | 1992-117483 | 4/1992 |
| JP | 1994-256758 | 9/1994 |
| JP | 7-26027 | 1/1995 |
| JP | 7-62337 | 3/1995 |
| RU | 2095836 C1 | 10/1997 |
| WO | WO 98/37115 | 8/1998 |
| WO | WO 01/57106 A1 | 8/2001 |
| WO | WO 02/04535 A1 | 1/2002 |
| WO | WO 02/057070 A2 | 7/2002 |
| WO | WO 03/008009 A1 | 1/2003 |
| WO | WO 03/077033 A2 | 9/2003 |

OTHER PUBLICATIONS

Nalwa, H.S. and Miyata S. Editors, *Nonlinear Optics of Organic Molecules and Polymers* by CRC Press 1997.

"Chromogenic Materials (Inorganic Photochromic)", *Kirk Othmer Encyclopedia of Chemical Technology*, Fourth Edition, vol. 6, pp. 322-325.

"Photochromism", *Techniques of Chemistry*, vol. III, Glenn H. Brown, Editor, John Wiley and Sons, Inc., New York (1971).

"Electrically Conductive Polymers," *Kirk Othmer Encyclopedia of Chemical Technology*, Fourth Edition, vol. 9, pp. 61-88.

"Redox Polymerization" by G.S. Misra, *Prog. Polym. Sci.* vol. 8, pp. 61-131 (1982).

"Preparation and optical properties of polystyrene nanocapsules containing photochromophores" by Mijeong Han et al., PITCAL Materials, Korea Research Institute of Chemical Technology, pp. 579-583 (2002).

"Nano-Encapsulation of Photochromic Compounds Using Diblock Copolymers" by Young J. Kim et al., Polymer Preprints, pp. 1226-1227 (2002).

"Synthesis and Polymerization of Amphiphilic Methacrylates Containing Permanent Dipole Azobenzene Chromophores" by Angelina Altomare et al., Journal of Polymer Science: Part A: Polymer Chemistry, vol. 39, pp. 22957-22977, John Wiley & Sons, Inc, (2001).

Methacrylic polymers containing permanent dipole azobenzene chromophores spaced from the main chain. $^{13}$CNMR spectra and photochromic properties", Angelina Altomare, et al., University of Piza, Department of Chemistry, Marcromol. Chem. Phys. 200, No. 3, pp. 601-608 (1998).

"Methacrylic Polymers Conaining Permanent Dipole Azobenzene Chromophores Spaced from the Main Chain Synthesis and Characterization", Angelina Altomare, et al., Polymer International 47 pp. 419-427 (1998).

"Halographic Gratings in Azobenzene Side-Chain Polymethacrylates", Luisa Andruzzi, et al., American Chemical Society, Marcomolecules, pp. 448-454 (1999).

U.S. Appl. No. 10/876,031, filed Jun. 24, 2004, Aqueous Dispersions of Microparticles Having a Nanoparticulate Phase and Coating Compositions Containing the Same.

* cited by examiner

METHODS FOR PRODUCING PHOTOSENSITIVE MICROPARTICLES, NON-AQUEOUS DISPERSIONS THEREOF AND ARTICLES PREPARED THEREWITH

CROSS-REFERENCE TO RELATED APPLICATIONS

This application is a continuation-in-part of U.S. patent application Ser. No. 10/892,919, filed on Jul. 16, 2004 which is incorporated herein by reference in its entirety.

BACKGROUND OF THE INVENTION

The present invention is directed to non-aqueous dispersions of photosensitive polymeric microparticles. The present invention is also directed to methods of producing such non-aqueous dispersions, curable film-forming compositions containing them, and photosensitive coated substrates.

Photosensitive materials demonstrate a response to electromagnetic radiation, including infrared, visible and ultraviolet radiation as well as light amplification by stimulated emission or laser. This response can be a type of luminescence in which visible radiation is emitted by a photosensitive material after exposure, e.g., fluorescent and phosphorescent materials; in which there is a change in the wavelength of the electromagnetic radiation passing through the material, e.g., non-linear optical materials; or in which there is a reversible change in color, e.g., photochromic materials.

Aqueous dispersions of photosensitive microparticles, and waterborne film-forming compositions containing them, can demonstrate several disadvantages. For example, waterborne film-forming compositions tend to generate foam during formulation, far more so than solventborne compositions. Foaming can make application difficult. Expensive humidity controls are often needed for application of waterborne film-forming compositions, since relative humidity affects a coating's flow properties and drying rates. Choices for adjuvant organic solvents can be limited in waterborne compositions because of evaporation rates and poor compatibility with the aqueous medium. Also high surface tension of water results in difficult wetting of certain substrates. Production equipment and lines which come into contact with waterborne compositions need to be corrosion resistant. This usually involves using plastic or expensive stainless steel in the production environment. Waterborne compositions can be difficult to render acid free due to acid's stabilization mechanism in water. In waterborne coatings, it also becomes problematic to use materials having water sensitive functional groups such as epoxy groups because appearance problems such as blushing in humid environments can develop. Microorganism growth also can be a problem in waterborne compositions.

There are products that take advantage of the phenomena demonstrated by photosensitive materials, e.g., optical elements such as optical memory elements and display elements. Although products incorporating aqueous core/shell microparticles that demonstrate photosensitive properties are known, it is desirable to provide non-aqueous products in which the properties of the photosensitive materials in the microparticles can be controlled readily, so that the drawbacks of waterborne compositions can be avoided. It is also desirable that certain physical properties of the end-product, such as hardness or abrasion resistance, be controlled without adversely affecting the properties of the photosensitive materials used in such products.

DETAILED DESCRIPTION OF THE INVENTION

As used in this specification and the appended claims, the singular forms "a," "an," and "the" include plural referents unless expressly and unequivocally limited to one referent.

For the purposes of this specification, unless otherwise indicated, all numbers expressing quantities of ingredients, reaction conditions, and other parameters used in the specification and claims are to be understood as being modified in all instances by the term "about". Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

All numerical ranges herein include all numerical values and ranges of all numerical values within the recited range of numerical values. Notwithstanding that the numerical ranges and parameters setting forth the broad scope of the invention are approximations, the numerical values set forth in the specific examples are reported as precisely as possible. Any numerical value, however, inherently contain certain errors necessarily resulting from the standard deviation found in their respective testing measurements.

The various embodiments and examples of the present invention as presented herein are each understood to be non-limiting with respect to the scope of the invention.

The term "monomer" includes single monomer units and oligomers that comprise a few monomer units.

The term "actinic radiation" includes light with wavelengths of electromagnetic radiation ranging from the ultraviolet ("UV") light range, through the visible light range, and into the infrared range. Actinic radiation which can be used to cure coating compositions used in the present invention generally has wavelengths of electromagnetic radiation ranging from 150 to 2,000 nanometers (nm), from 180 to 1,000 nm, or from 200 to 500 nm. Ultraviolet radiation having a wavelength ranging from 10 to 390 nm also can be used. Examples of suitable ultraviolet light sources include mercury arcs, carbon arcs, low, medium or high pressure mercury lamps, swirl-flow plasma arcs and ultraviolet light emitting diodes. Suitable ultraviolet light-emitting lamps can include, but are not limited to, medium pressure mercury vapor lamps having outputs ranging from 200 to 600 watts per inch (79 to 237 watts per centimeter) across the length of the lamp tube.

In accordance with the present invention, a non-aqueous dispersion of photosensitive polymeric microparticles is provided, comprising: a) an organic continuous phase comprising an organic solvent; and b) photosensitive polymeric microparticles dispersed in the organic continuous phase, wherein the microparticles comprise an at least partially polymerized component having integral surface and interior domains, wherein the surface domain comprises a polymeric material that is solubilized by the organic solvent, the interior domain comprises a polymeric material that is insoluble in the organic solvent, and the surface domain and/or interior domain is photosensitive.

The organic solvent in the organic continuous phase typically is a polar solvent and may comprise, for example, one or more alcohols, such as monoalcohols or diols, including glycols, ethers, amides, nitriles, esters, ketones, and/or lactams. Polar solvents, by definition, have molecules whose electric charges are unequally distributed, leaving one end of each molecule mare positive than the other, such that solutes dissolved therein are prone to form ions. Examples of specially suitable solvents can include n-butanol, isobutanol, isopropanol, benzyl alcohol, ethylene glycol, propylene glycol, tetrahydrofurfuryl alcohol, propylene glycol monobutyl ether, ethylene glycol monohexyl ether, ethylene glycol monobutyl ether, diethylene glycol butyl ether, ethylene glycol monomethyl ether, propylene glycol monomethyl ether, dimethylformamide, N-methylpyrrolidone, methyl ethyl ketone, methyl amyl ketone, TEXANOL®solvent, which is reported to be 2,2,4-trimethyl-1,1,3-pentanediol monoisobutyrate and which is available from Eastman Chemical Co., and mixtures of such solvents. The use of organic solvents can aid in the process of forming the crosslinked polymeric microparticles.

Photosensitive polymeric microparticles are dispersed in the organic continuous phase. The microparticles comprise an at least partially polymerized component having integral surface and interior domains. Either or both of the surface domain and interior domain may be photosensitive. The surface domain comprises a polymeric material that is solubilized by the organic solvent and the interior domain comprises a polymeric material that is insoluble in the organic solvent.

The non-aqueous dispersions of the present invention may be prepared in any of various ways. For example, a non-aqueous dispersion may be prepared as follows:
a) preparing an aqueous dispersion of a photosensitive material and a polymerizable component, wherein the polymerizable component comprises at least one hydrophilic functional group and at least one hydrophobic functional group;
b) subjecting the dispersion of a) to conditions sufficient to form microparticles, such as high shear stress conditions;
c) at least partially polymerizing the polymerizable component;
d) combining the dispersion with an organic continuous phase comprising an organic solvent, typically a polar solvent; and
e) removing water from the dispersion such that the final water content of the non-aqueous dispersion is less than 30 percent by weight. It should be noted that e) may be performed before or after d).

The non-aqueous dispersions of the present invention can comprise an amount of water that is less than 30 weight percent.

The polymerizable component in the aqueous dispersion prepared in step a) may comprise at least one substantially hydrophilic monomer and at least one substantially hydrophobic monomer, the hydrophilic monomer and the hydrophobic monomer being capable of at least partially forming microparticles of the polymerizable component with which the photosensitive material, such as a photochromic material, is associated. Alternatively, the aqueous dispersion may comprise an effective amount of at least one photosensitive material and at least one polymerizable component comprising at least one hydrophilic functional group and at least one hydrophobic functional group. The photosensitive material(s) and the polymerizable component(s) are capable of forming at least partially crosslinked photosensitive polymeric microparticles. The polymerizable component also may comprise at least one substantially hydrophilic prepolymer, at least one substantially hydrophobic prepolymer, and an effective amount of at least one organic photochromic material comprising at least one polymerizable group, the polymerizable component being capable of forming at least partially crosslinked photochromic polymeric microparticles.

The polymerizable component can further comprise a material that is copolymerizable with at least one of the substantially hydrophilic and substantially hydrophobic monomers, which material is hereinafter referred to as the "copolymerizable material". Moreover, the polymerizable component can possess functionality capable of reacting with crosslinking materials, to be compatible with host materials and to have properties associated with the photosensitive polymeric microparticles described hereinafter.

The phrase "being capable of at least partially forming microparticles of the polymerizable component with which the photosensitive material is associated" refers to the polymerizable component being suitable to self assemble into at least partially formed microparticles. Self-assembly of the microparticles is due to the difference in the hydrophilicity and hydrophobicity associated with the hydrophilic functional group(s) of the substantially hydrophilic monomer and the hydrophobic functional group(s) of the substantially hydrophobic monomer comprising the polymerizable component. The photosensitive material can be associated with the microparticles by the selection of hydrophilic photosensitive material(s), hydrophobic photosensitive material(s) or photosensitive material having another property that allows it to chemically or physically associate with the resulting microparticles or the polymerizable component.

After formation of the microparticles, the microparticles typically are polymerized. The phrase "to at least partially polymerize and form at least partially crosslinked polymeric microparticles" refers to the polymerizable component in which from some to all of the monomers or prepolymers react and combine to form chain-like polymeric materials and the reactive groups on from some to all of these chain-like polymeric materials react and crosslink to form polymeric networks in which from some to all of the chains are interconnected. The aforementioned reactive groups are chemical groups capable of undergoing a polymerization reaction as commonly known to those skilled in the art. Examples of such polymerizable groups include methacryloyloxy, acryloyloxy, vinyl, allyl, carboxyl, amino, mercapto, epoxy, hydroxy and isocyanato groups.

The polymerized microparticles formed in steps b) and c) generally have a core/shell structure that enables them to be especially useful for preparing the non-aqueous dispersions of the present invention, in particular, polar non-aqueous dispersions. The core (i.e., the interior domain) and shell (i.e., the surface domain) polymers are covalently attached or associated to each other. Otherwise, the compatibility of the shell polymer with the solvent in the organic continuous phase would cause the shell to dissolve away from the core material. Also, the core is crosslinked and/or comprises a material that is inherently insoluble in the organic continuous phase and the shell comprises a polymer that, if it were not attached to the insoluble core, would be completely soluble in the organic continuous phase. The solubility of the shell polymer makes the core/shell microparticle compatible with the solvent and the insolubility of the core maintains the integrity of the microparticle by preventing the microparticle from completely dissolving in the solvent.

When combining the dispersion with the organic continuous phase in step d), the dispersion may be poured into the organic continuous phase or vice versa. Water is removed from the dispersion using known methods, such as by ultrafiltration, distillation under reduced pressure or by centrifuge.

A further method for producing a non-aqueous dispersion of photosensitive microparticles in accordance with the present invention comprises:
a) preparing an aqueous dispersion of a substantially hydrophilic prepolymer component;

b) preparing an aqueous dispersion of a substantially hydrophobic prepolymer component, wherein the dispersion of a) and/or b) further comprises a photosensitive material;

c) combining the dispersions of a) and b) to form a mixture and subjecting the mixture to conditions sufficient to form microparticles;

d) polymerizing the prepolymer components in the mixture;

e) combining the mixture with an organic continuous phase comprising an organic solvent, typically a polar solvent; and f) removing water from the mixture such that the final water content of the non-aqueous dispersion is less than 30 percent by weight. It should be noted that f) may be performed before or after e).

Adjuvant materials also can be incorporated into the non-aqueous dispersion, e.g., conventional ingredients that aid in processing the polymerizable component or impart desired characteristics to the resulting microparticles. Examples of such ingredients include rheology control agents, surfactants, initiators, catalysts, cure-inhibiting agents, reducing agents, acids, bases, preservatives, crosslinking materials, free radical donors, free radical scavengers, stabilizers such as ultraviolet and thermal stabilizers, and adhesion promoting agents, such as organofunctional silanes, siloxanes, titanates and zirconates, which adjuvant materials are known to those skilled in the art.

The non-aqueous dispersions of the present invention optionally may include other colorants such as nanopigments, nanotints, and/or non-photosensitive dyes. Such colorants are particularly useful in the preparation of so-called "dark-to-darker" coating compositions. The term "nanopigment" refers to a pigment for which the mean size of the primary particles is up to 100 nm.

As previously stated, the aqueous dispersion used to prepare the non-aqueous dispersions of the present invention may comprise at least one polymerizable component comprising at least one substantially hydrophilic monomer and at least one substantially hydrophobic monomer. As used herein, the terms "substantially hydrophilic monomer" and "substantially hydrophobic monomer" refer to the relative hydrophilic or hydrophobic character of the monomers compared one to the other. The substantially hydrophilic monomer of the polymerizable component is more hydrophilic than the substantially hydrophobic monomer. Correspondingly, the substantially hydrophobic monomer of the polymerizable component is more hydrophobic than the substantially hydrophilic monomer. One method of determining the hydrophilic/hydrophobic character of a material is the well-known Hydrophilic-Lipophilic Balance (HLB) number. HLB numbers generally range from 1 to 20, with 1 being an oil-soluble material and 20 being a water-soluble material. Using this system, materials designated herein as substantially hydrophobic would demonstrate an HLB of less than 10 while materials designated as substantially hydrophilic would demonstrate an HLB of greater than 10.

The proportions of the substantially hydrophilic monomer(s) to the substantially hydrophobic monomer(s) can vary widely. The weight percent of the substantially hydrophilic monomer and the substantially hydrophobic monomer in the polymerizable component can each range from 2 to 98 weight percent, based on the total polymerizable component solids weight of 100 percent. Examples of proportions of substantially hydrophilic monomers to substantially hydrophobic monomers can be but are not limited to 20:80 and 50:50.

In certain embodiments, the substantially hydrophilic monomer is substantially compatible with water, has an affinity for water, and/or is capable of at least partially dissolving in water using conventional mixing means. The substantially hydrophilic monomers used in the polymerizable monomer component of the present invention can comprise any hydrophilic monomer known to those skilled in the art. Examples of such hydrophilic monomers include monomers comprising hydrophilic functional groups such as: acid-functional groups; hydroxyl-functional groups; nitrile-functional groups; amino-functional groups; amide-functional groups; carbamate-functional groups; ionic-functional groups such as quaternary ammonium or sulfonium groups; or mixtures of such functional groups.

The degree of hydrophilicity and hydrophobicity of the monomers used to prepare the polymerizable component can be varied, as is known to those skilled in the art. A substantially hydrophobic monomer of the polymerizable component can be converted into a substantially hydrophilic monomer. For example, isocyanato groups on a hydrophobic monomer of the polymerizable component can be functionalized with siloxane groups by reacting the isocyanato groups with an organofunctional silane such as aminopropyl triethoxysilane. Upon dispersion in water, the hydrolyzable groups, e.g., alkoxysilanes, are at least partially hydrolyzed to form hydrophilic silanol groups. If allowed to react with alcohol or themselves, these hydrophilic groups can revert to hydrophobic groups. The same functionalization process can be performed with available isocyanato groups on the polymerized and crosslinked photosensitive polymeric microparticles.

Examples of suitable organo-functional silanes for such a hydrophobic to hydrophilic conversion process can include but are not limited to: 4-aminobutyltriethoxysilane, carboxymethyltriethoxysilane, isocyanatopropyltriethoxysilane, 3-mercaptopropyltrimethoxysilane, mercaptomethylmethyl-diethoxysilane, or mixtures thereof.

Examples of hydrophilic acid-functional group-containing monomers can include but are not limited to acrylic acid, methacrylic acid, beta-carboxyethyl acrylate, acryloxypropionic acid, 2-acrylamide methylpropane sulfonic acid, acrylic (3-sulfopropyl)ester acids, crotonic acid, dimethylolpropionic acid, fumaric acid, mono($C_1$-$C_8$)alkyl esters of fumaric acid, maleic acid, mono($C_1$-$C_8$)alkyl esters of maleic acid, itaconic acid, mono($C_1$-$C_8$)alkyl esters of itaconic acid and mixtures thereof.

Examples of hydrophilic hydroxyl-functional group-containing monomers can include but are not limited to 2-hydroxyethyl methacrylate, 2-hydroxyethyl acrylate, poly(ethylene glycol) acrylate, poly(ethylene glycol) methacrylate, hydroxypropyl methacrylate, hydroxypropyl acrylate, hydroxybutyl methacrylate, hydroxybutyl acrylate, hydroxymethyl ethyl acrylate, hydroxy methylpropyl acrylate, dicaprolactone acrylate, diethanolamine, dimethanolamine or mixtures thereof. Examples of nitrile-functional group-containing monomers include methacrylonitriles and acrylonitriles.

Examples of hydrophilic amino-functional group-containing monomers can include but are not limited to allylamine, dimethylallylamine, 2-(dimethylamino)ethyl methacrylate, 2-(t-butylamino)ethyl methacrylate, 4-aminostyrene, dimethylaminoethyl vinyl ether, and N-(3-dimethylaminopropyl) methacrylamide.

Examples of suitable hydrophilic ionic-functional group-containing monomers can include but are not limited to allyltrimethylammonium chloride, 2-trimethylammonium ethyl acrylic chloride, and vinylbenzyl dimethyl sulfonium chloride.

Examples of hydrophilic amide-functional group-containing monomers can include but are not limited to methacrylamides and acrylamides.

Examples of hydrophilic carbamate-functional group-containing monomers can include but are not limited to allyl carbamate, vinyl carbamate, the reaction product of hydroxyethyl carbamate and methacrylic anhydride, and the reaction product of hydroxyethyl carbamate with isophorone di-isocyanate and hydroxyethyl acrylate.

Examples of hydrophilic vinyl-functional group-containing monomers can include but are not limited to vinyl acetate, vinyl pyrrolidones and vinyl propionates.

In certain embodiments of the present invention, the hydrophobic monomer(s) can comprise a monomer that is substantially free of hydrophilic functionality and is substantially incompatible with water, has less affinity for water and/or is capable of only minimally dissolving in water using conventional mixing means. The hydrophobic monomer(s) used in the polymerizable component can include any hydrophobic monomer known to those skilled in the art. Examples of hydrophobic functional groups can include but are not limited to hydrocarbons having 4 or more carbon atoms. Further non-limiting examples of such functional groups are included in the description of hydrophobic monomers hereinafter.

Non-limiting examples of hydrophobic monomers can include free-radically polymerizable monomers which include, but are not limited to, vinyl aromatic monomers, e.g., styrene, α-methyl styrene, t-butyl styrene and vinyl toluene; vinyl and vinylidene halides, e.g., vinyl chloride and vinylidene chloride; vinyl esters; vinyl ethers, vinyl butyrates, alkyl esters of acrylic and methacrylic acids having from 4 to 17 carbon atoms in the alkyl group, including butyl methacrylate, butyl acrylate, cyclohexyl methacrylate, cyclohexyl acrylate, 4-tert-butylcyclohexylacrylate, 2-ethylhexyl methacrylate, 2-ethylhexyl acrylate, butyl hexylmethacrylate, butyl hexylacrylate, isooctylmethacrylate, isooctylacrylate, isodecyl methacrylate, isodecyl acrylate, isobornyl methacrylate, isobornyl acrylate, lauryl methacrylate and lauryl acrylate; and mixtures thereof.

Other suitable hydrophobic monomers can include, for example, organo-functional silanes having substantially non-hydrolyzable substituents, such as alkoxy groups having 3 or more carbon atoms.

In certain embodiments, the polymerizable component comprises at least one copolymerizable material that is different from the at least one substantially hydrophilic monomer and the at least one substantially hydrophobic monomer. The copolymerizable material(s) can be reacted with the substantially hydrophilic monomer(s) to form a substantially hydrophilic prepolymer and/or with the substantially hydrophobic monomer(s) to form a substantially hydrophobic prepolymer.

The copolymerizable material(s) can be any material that is copolymerizable with at least one of the substantially hydrophilic monomer(s) and the substantially hydrophobic monomer(s). For example, the copolymerizable material(s) can be a structural backbone forming material. Suitable copolymerizable material(s) can be chosen from: ethylenically unsaturated group-containing materials; isocyanate-containing materials known to those skilled in the art, e.g., reaction products of isocyanates and other correspondingly reactive materials, e.g., polyols, in which the reaction product has at least one reactive isocyanato group; hydroxyl-group containing monomers known to those skilled in the art; epoxy-group containing monomers known to those skilled in the art; carboxy-group containing monomers known to those skilled in the art; carbonate-group containing monomers known to those skilled in the art, e.g., a reaction product of a polyol comprising at least one carbonate group and vinyl monomer and a reaction product of a polyol comprising at least one carbonate group and an isocyanate comprising one reactive isocyanate group and at least one polymerizable double bond as described in U.S. Patent Application Publication US 2003/0136948 (now U.S. Pat. No. 6,998,072) paragraphs [0041] to [0065], which disclosure is incorporated herein by reference; or mixtures of such copolymerizable materials.

The copolymerizable material(s) also can include silyl-group containing materials, e.g. organo-functional silanes having at least one polymerizable group, such as the previously described organo-functional silanes.

Non-limiting examples of suitable copolymerizable materials such as ethylenically unsaturated group-containing monomers can include vinyl monomers and ethylenically unsaturated monomers having a functional group chosen from hydroxyl, carboxyl, amino, mercapto, (meth)acryloyloxy, e.g., methacryloyloxy or acryloyloxy, isocyanato or mixtures thereof, which are known to those skilled in the art. The copolymerizable materials can have two or more of the same polymerizable group or two or more of different polymerizable groups. Often, the copolymerizable material is chosen from (meth)acrylic monomers having at least one functional group chosen from hydroxyl, amino, mercapto or mixtures thereof.

When necessary, the substantially hydrophilic monomer(s) and/or the substantially hydrophobic monomer(s) used in the formation of the polymerizable component are chosen for the properties provided by the glass transition temperatures of the respective polymers upon polymerization, as is known to those skilled in the art. For example, monomers that form polymers having glass transition temperatures higher than room temperature, e.g. 23° C., tend to form more rigid or harder polymers while monomers that form polymers having glass transition temperatures less than room temperature tend to be softer and more flexible. The properties of the monomers used to form the polymeric microparticle environment can affect the performance of the photosensitive materials. For example, in the case of organic photochromic materials that depend on conformational changes to demonstrate an activated and unactivated state, a soft and flexible environment permits more freedom of movement and can allow an increase in performance, or a more rigid and harder environment permits less freedom of movement and can cause a decrease in performance. Formulating the polymerizable component with materials having properties that can affect the performance of the photosensitive materials enables the resulting photosensitive polymeric microparticle to have an environment in which the performance of the photosensitive materials can be controlled independently of the environment surrounding the photosensitive polymeric microparticle. For example, the photosensitive polymeric microparticle can itself be soft and flexible but be surrounded by or imbedded within a rigid and hard matrix or environment.

Upon polymerization, the substantially hydrophilic monomer(s) and the substantially hydrophobic monomer(s) each form polymers, the glass transition temperatures of which can vary widely. The glass transition temperature of a polymer formed upon polymerization of the substantially hydrophobic monomer(s) may be greater than or equal to the glass transition temperature of the polymer formed upon polymerization of the substantially hydrophilic monomer(s). Alternatively, the glass transition temperature of the polymer formed upon polymerization of the substantially hydrophobic monomer(s)

is less than the glass transition temperature of the polymer formed upon polymerization of the substantially hydrophilic monomer(s).

The substantially hydrophobic monomer(s) may be selected so as to form a polymer that upon polymerization has a glass transition temperature less than 23° C., e.g., from 22.9° C. to −100° C. or from 22° C. to −90° C. Alternatively, the substantially hydrophilic monomer(s) is selected so as to form a polymer that upon polymerization has a glass transition temperature equal to or greater than 23° C., e.g., from 23° C. to 130° C. or from 24° C. to 100° C.

The substantially hydrophilic monomer(s) and/or the substantially hydrophobic monomer(s) can be urethane materials adapted to form substantially rigid and/or substantially flexible segments. The concept of preparing urethane material in order to form rigid or flexible segments by choosing the components, e.g., isocyanates and polyols, to form the appropriate type of segment is known to those skilled in the art. See for example the discussion of hard and soft segments in U.S. Pat. No. 6,187,444 at column 3, line 49 to column 4, line 46, which disclosure is incorporated herein by reference. A rigid segment of urethane material is one that gives the resulting material in which it is used a stiffness that is not easily bent without breaking. A flexible segment of urethane material is one that results in a material being pliable and capable of being bent or moved from a straight line or form without breaking. In certain embodiments of the present invention, the substantially hydrophobic monomer is a urethane material, e.g., a urethane (meth)acrylate prepolymer, that is adapted to form a flexible-segment and the substantially hydrophilic monomer(s) is a urethane material, e.g., a urethane (meth)acrylate prepolymer, adapted to form a rigid-segment. Alternatively, the substantially hydrophobic monomer(s) is a urethane material that is adapted to form a rigid-segment and the substantially hydrophilic monomer(s) is a urethane material adapted to form a flexible-segment.

The urethane materials of the present invention can be prepared with isocyanates and polyols, amines and/or thiols that can vary widely. Suitable materials and methods are known to those skilled in the art of urethane preparation.

When the urethane-forming components, such as organic components having hydroxyl, mercapto and/or amino groups and isocyanates, are combined to produce the urethane materials of the present invention, the relative amounts of the ingredients are typically expressed as a ratio of the available number of reactive isocyanate groups to the available number of reactive hydroxyl, mercapto and/or amino groups, e.g., an equivalent ratio of NCO:X wherein X represents OH, SH, NH and/or $NH_2$. For example, a ratio of NCO:X of 1.0:1.0 is obtained when the weight of one NCO equivalent of the isocyanate component is reacted with the weight of one X equivalent of the hydroxyl, mercapto and/or amino group-containing component. The urethane materials have an equivalent ratio of NCO:X that can vary widely. For example, the equivalent ratio of NCO:X can range between 0.3:1.0 and 3.0:1.0 and all inclusive ranges therebetween. When the ratio is greater than 1.0:1.0, the excess isocyanato groups can be blocked and/or further reacted, e.g., with urea or organofunctional silanes, to form hydrophilic groups, as is known to those skilled in the art.

Non-limiting examples of isocyanate components can include modified or unmodified isocyanates having free, blocked, e.g., with suitable blocking agents, or partially blocked isocyanate-containing components, as known to those skilled in the art, chosen from: toluene-2,4-diisocyanate; toluene-2,6-diisocyanate; diphenyl methane-4,4'-diisocyanate; diphenyl methane-2,4'-diisocyanate; para-phenylene diisocyanate; biphenyl diisocyanate; 3,3'-dimethyl-4,4'-diphenylene diisocyanate; tetramethylene-1,4-diisocyanate; hexamethylene-1,6-diisocyanate; 2,2,4-trimethyl hexane-1,6-diisocyanate; lysine methyl ester diisocyanate; bis(isocyanato ethyl)fumarate; isophorone diisocyanate; ethylene diisocyanate; dodecane-1,12-diisocyanate; cyclobutane-1,3-diisocyanate; 2-heptyl-3,4-bis(9-isocyanatononyl)-1-pentyl-cyclohexane; cyclohexane-1,3-diisocyanate; cyclohexane-1,4-diisocyanate; dicyclohexylmethane-4,4-diisocyanate or methylene bis(4-cyclohexylisocyanate); methyl cyclohexyl diisocyanate; hexahydrotoluene-2,4-diisocyanate; hexahydrotoluene-2,6-diisocyanate; hexahydrophenylene-1,3-diisocyanate; hexahydrophenylene-1,4-diisocyanate; m-tetramethylxylene diisocyanate; p-tetramethylxylene diisocyanate; perhydrodiphenylmethane-2,4'-diisocyanate; perhydrodiphenylmethane-4,4'-diisocyanate or mixtures thereof. Triisocyanates such as biurets of any suitable diisocyanate including 1,4-tetramethylene diisocyanate and 1,6-hexamethylene diisocyanate may be used. Also, biurets of cycloaliphatic diisocyanates such as isophorone diisocyanate and 4,4'-methylene-bis-(cyclohexyl isocyanate) can be employed. Examples of suitable aralkyl diisocyanates from which biurets may be prepared are meta-xylylene diisocyanate and $\alpha,\alpha,\alpha',\alpha'$-tetramethylmeta-xylylene diisocyanate. Other trifunctional isocyanates may also be used, for example, trimers of isophorone diisocyanate, triisocyanato nonane, triphenylmethane triisocyanate, 1,3,5-benzene triisocyanate, 2,4,6-toluene triisocyanate, an adduct of trimethylol and tetramethyl xylene diisocyanate sold under the trade name CYTHANE 3160 by CYTEC Industries, and DESMODUR N 3300 and DESMODUR N 3600, which are trimers of hexamethylene diisocyanate, available from Bayer Corporation.

When the substantially hydrophilic monomer is prepared from triisocyanates (isocyanurates in particular), the non-aqueous dispersions containing photosensitive microparticles prepared therefrom may be formulated into coatings containing aminoplast resins, which as a result may demonstrate improved adhesion to substrates in boiling water as measured by haze, compared to similar coatings prepared with non-aqueous dispersions containing photosensitive microparticles prepared from diisocyanates. Other advantages of triisocyanates include faster fade kinetics of photochromic microparticles prepared therefrom, compared to similar photochromic microparticles prepared from diisocyanates. Also, a substantially hydrophilic monomer prepared from a triisocyanate tends to have better long-term stability than an analogous hydrophilic monomer prepared from a diisocyanate.

When the urethane material is formed in the presence of a catalyst, the catalyst can be chosen from: Lewis bases, Lewis acids and insertion catalysts, as is described in *Ullmann's Encyclopedia of Industrial Chemistry,* 5th Edition, 1992, Volume A21, pp. 673 to 674, which disclosure is incorporated herein by reference.

Non-limiting examples of organic polyols that can be used in the present invention as urethane-forming components can include (a) polycarbonate polyols; (b) low molecular weight polyols, e.g., polyols having a weight average molecular weight less than 500, such as aliphatic diols, for example, C2-C10 aliphatic diols, trials, polyhydric alcohols and alkoxylated low molecular weight polyols; (c) polyester polyols; (d) polyether polyols; (e) amide-containing polyols; (f) polyacrylic polyols; (g) epoxy polyols; (h) polyhydric polyvinyl alcohols; (i) urethane polyols; or (j) mixtures thereof. The aforementioned polycarbonate polyols can be formed by methods known in the art, as disclosed, for example, in U.S. Pat. No. 5,143,997 at column 3, line 43 to column 6, line 25, and U.S. Pat. No. 5,527,879 at column 2, line 10 to column 3, line 48. For example, polycarbonates are customarily obtained from the reaction of alcohols or phenols with phosgene or from the transesterification of alcohols or phenols with dialkyl or diaryl carbonates. In particular embodiments of the present invention, polycarbonate functional diols are used that have been prepared by the reaction of a dial such as 1,6-hexanediol, $C_2$ (ethylene glycol) to $C_{36}$ dials such as neopentylglycol, butanediol, 1,10-decanediol, butylethyl propanediol, 2-ethyl-1,3-hexanediol, cyclohexanedimethanol, 2,2,4-trimethylpentane-1,3-diol, Esterdiol 204, and/or polytetrahydrofuran (Mn 250), with either phosgene or dimethylcarbonate. Polycarbonate diols of Mn<2000 are often employed, such as polycarbonate dials of Mn<1000. The use of such polycarbonate functional dials is particularly suitable when the non-aqueous dispersions are to be used in the preparation of solventborne coating compositions that contain non-hydroxyl solvents; e.g., esters, ethers, aromatic hydrocarbons, and/or ketones. Improved compatibility is demonstrated between the microparticles and solvents, evidenced by reduced particle aggregation.

The other polyols also can be prepared by methods known in the art, as described in U.S. Pat. No. 6,187,444 at column 7, line 25 to column 12, line 15. Such disclosures are hereby incorporated herein by reference.

The organic polyols, e.g., dials, trial, etc., that are used to prepare the urethane material of the present invention, can be used to form prepolymers or adducts with the isocyanates. Also, substantially hydrophilic or substantially hydrophobic prepolymers can each be prepared by the reaction of a hydrophilic monomer, such as dimethylol propionic acid, or a hydrophobic monomer, such as a $C_8$ aliphatic diol, with the isocyanate reactive group of the prepolymer. Such prepolymers can be substantially hydrophilic or substantially hydrophobic urethane (meth)acrylate prepolymers, e.g., urethane acrylate prepolymers, urethane methacrylate prepolymers or a mixture thereof.

The non-aqueous dispersions of the present invention include an effective amount of at least one photosensitive material. The term "an effective amount of photosensitive material" means that amount of photosensitive material in the polymerizable component and resulting photosensitive polymeric microparticle which, when irradiated with an appropriate wavelength of electromagnetic radiation, produces a detectable response by instrument or visual observation such as a change in the wavelength or amount of radiation emitted by the photosensitive material, a change in the wavelength of the radiation passing through the photosensitive material or a change in the observed color of the photosensitive material. The term "photosensitive materials" includes photosensitive organic materials, photosensitive inorganic materials or mixtures thereof, but does not include colorants such as pigments and fixed tint dyes and conventional dichroic dyes unless the dichroic property is associated with a photochromic material as discussed hereinafter. Such colorants may be included as adjuvant component(s) in the non-aqueous dispersions and curable film-forming compositions of the present invention. In one example, the photosensitive material is chosen from fluorescent dyes, phosphorescent dyes, nonlinear optical materials, photochromic materials or mixtures thereof.

Optionally, the photosensitive material(s) further comprises one or more polymerizable groups described hereinbefore. Various methods for attaching polymerizable groups to photosensitive materials are known to those skilled in the art. See for example, U.S. Pat. No. 6,113,814 at column 8, line 42 to column 22, line 7, which disclosure is incorporated herein by reference. Additional methods that can be employed are those used for attaching functional groups to non-photosensitive materials, such as the methods described in U.S. Pat. No. 5,919,846 at column 2, line 35 to column 4, line 42. The photosensitive material can be at least partially bound to the chain-like polymeric materials of the polymerizable component.

As known to those skilled in the art, fluorescent and phosphorescent dyes emit visible radiation when an atom or molecule passes from a higher to a lower electronic state. The difference between the two dyes being that the emission of luminescence after exposure to radiation from the fluorescent dye occurs sooner than that from a phosphorescent dye.

Fluorescent dyes known to those skilled in the art can be used as photosensitive materials in the present invention. See Haugland, R. P. (1996) *Molecular Probes Handbook for Fluorescent Probes and Research Chemicals*, 6th edition. Examples of fluorescent dyes include anthracenes, tetracenes, pentacenes, rhodamines, benzophenones, coumarins, fluoresceins, perylenes and mixtures thereof.

Phosphorescent dyes known to those skilled in the art can be used as photosensitive materials in the present invention. Examples of phosphorescent dyes include: metal-ligand complexes such as tris(2-phenypyridine)iridium [Ir(ppy)3]; 2,3,7,8,12,13,17,18-octaethyl-21H,23H-porphyrin platinum (II) [PtOEP] and organic dyes such as eosin (2',4',5',7'-tetrabromofluorescein), 2,2'-bipyridine and erythrosin (2',4', 5',7'-tetraiodofluorescein).

Non-linear optical materials (NLO) can have a distinct crystalline structure, which is optically anisotropic with respect to electromagnetic radiation, but can also be amorphous, e.g., gallium arsenate, as well as polymeric incorporating a variety of chromophores such as disperse red 1 [2873-52-8] 4-(N-ethyl-N-2-hydroxyethyl)amino-4'-nitroazobenzene. As used herein the term "anisotropic" means having at least one property that differs in value when measured in at least one different direction. Thus, "optically anisotropic materials" are materials that have at least one optical property that differs in value when measured in at least one different direction. Based on the anisotropic nature of NLO materials, ordering or alignment of the materials, as known to those skilled in the art, is used to take full advantage of the nonlinear behavior of these materials. Some NLO materials change light passing through them, depending upon orientation, temperature, light wavelength etc. An example of this property of NLO materials is that a red light of low wavelength enters a crystal of ammonium dihydrogen phosphate which releases photons of accumulated higher energy and exits as blue light of a higher wavelength. See, D. Arivuoli "Fundamentals of nonlinear optical materials" PRAMANA-journal of physics Vol 57, Nos 5 &6 November & December 2001, pp. 871-883, which disclosure is incorporated herein by reference.

NLO materials known to those skilled in the art can be used as photosensitive materials in the present invention. See Nalwa, H. S. and Miyata, S, Editors, *Nonlinear Optics of Organic Molecules and Polymers* by CRC, 1997. Examples of NLO materials in addition to the aforementioned materials include: 4-dimethylamine-4-nitrostilbene; 4-[4-(phenylazo)-1-naphthylazo]phenol; N-ethyl-N-(2-hydroxyethyl)-4-(4-nitrophenylazo)aniline; and (S)-(−)-1-(4-nitrophenyl)-2-pyrrolidinemethanol.

Photochromic materials have at least two states, a first state having a first absorption spectrum and a second state having a second absorption spectrum that differs from the first absorption spectrum, and are capable of switching between the two states in response to at least actinic radiation of at least two different wavelengths. For example, Isomer A of a photochromic material at the first absorption spectrum, e.g., a "clear" state, is exposed to light of a first wavelength and isomerizes to Isomer B at the second absorption spectrum, e.g., a "colored" state, which when exposed to light of a second and different wavelength or when exposure to the light of a first wavelength is discontinued isomerizes back to Isomer A. Typically, photochromic materials in the clear state are considered to be "unactivated" and in the colored state, to be "activated." Within the class of photochromic materials, there are thermally reversible and non-thermally reversible photochromic materials. Thermally reversible photochromic materials are capable of switching between a first and a second state in response to at least actinic radiation and reverting back to the first state in response to thermal energy, e.g., any form of heat, or removal of the activating radiation. Non-thermally reversible (or photo-reversible) photochromic materials are adapted to switch states in response to actinic radiation, but not thermal energy.

Both thermally reversible and non-thermally reversible photochromic materials can be adapted to display both photochromic and dichroic, e.g., at least partially linearly polarizing, properties under appropriate conditions and are referred to as photochromic-dichroic materials. As used herein, "at least partially linearly polarizing" means to confine from some to all of the vibrations of the electric field vector of lightwaves to one direction or plane. As discussed below in more detail, the photosensitive articles comprising optically anisotropic materials such as non-linear optical materials and/or photochromic-dichroic materials can be at least partially aligned.

Photochromic materials can include a wide variety of photochromic materials that can be used as photosensitive materials in the present invention. For example, the photochromic material may be chosen from an inorganic photochromic material, an organic photochromic material or a mixture thereof.

The inorganic photochromic material can comprise crystallites of silver halide, cadmium halide and/or copper halide. Other inorganic photochromic materials can be prepared, for example, by the addition of europium (II) and/or cerium(III) to a mineral glass such as a soda-silica glass. The inorganic photochromic materials may be added to molten glass and formed into particles that are incorporated into the aqueous composition of the present invention to form microparticles comprising such particulates. The glass particulates can be formed by any of a number of various methods known in the art, The inorganic photochromic materials are further described in *Kirk Othmer Encyclopedia of Chemical Technology*, 4th Edition, Volume 6, pages 322-325.

The photochromic material is often at least one organic photochromic material comprising at least one activated absorption maxima in the range from 300 to 1000 nanometers, as is known to those skilled in the art. In certain embodiments, the organic photochromic material comprises a mixture of (a) at least one organic photochromic material having a visible lambda max of from 400 to less than 550 nanometers, and (b) at least one organic photochromic material having a visible lambda max of from 550 to 700 nanometers.

The photochromic material can include the following classes of materials: pyrans, oxazines, fulgides, fulgimides, diarylethenes or mixtures thereof. The photochromic material(s) can be a thermally reversible photochromic material and/or a non-thermally reversible photochromic material. For example, the photochromic material(s) may be chosen from thermally reversible pyrans, thermally reversible oxazines, thermally reversible fulgides, thermally reversible fulgimides or mixtures thereof. Also, the photochromic material(s) may be a non-thermally reversible fulgide, non-thermally reversible fulgimide, non-thermally reversible diarylethene or a mixture thereof. The photochromic material may also be a photochromic-dichroic material.

Examples of photochromic pyrans that can be used herein include benzopyrans, and naphthopyrans, e.g., naphtho[1,2-b]pyrans, naphtho[2,1-b]pyrans, and indeno-fused naphthopyrans, such as those disclosed in U.S. Pat. No. 5,645,767 at column 2, line 16 to column 12, line 57, and heterocyclic-fused naphthopyrans, such as those disclosed in U.S. Pat. No. 5,723,072 at column 2, line 27 to column 15, line 55, U.S. Pat. No. 5,698,141 at column 2, line 11 to column 19, line 45, U.S. Pat. No. 6,153,126 at column 2, line 26 to column 8, line 60, and U.S. Pat. No. 6,022,497 at column 2, line 21 to column 11, line 46, which disclosures are hereby incorporated herein by reference, and spiro-9-fluoreno[1,2-b]pyrans, phenanthropyrans, quinolinopyrans; fluoroanthenopyrans and spiropyrans, e.g., spiro(benzindoline)naphthopyrans, spiro(indoline)benzopyrans, spiro(indoline)naphthopyrans, spiro(indoline)quinolinopyrans and spiro(indoline)pyrans. More specific examples of naphthopyrans and complementary organic photochromic substances are described in U.S. Pat. No. 5,658,501 at column 1, line 64 to column 13, line 17, which disclosure is hereby incorporated herein by reference. Spiro(indoline)pyrans are also described in the text, *Techniques in Chemistry*, Volume III, "Photochromism", Chapter 3, Glenn H. Brown, Editor, John Wiley and Sons, Inc., New York, 1971, which is also hereby incorporated herein by reference.

Examples of photochromic oxazines that can be used in conjunction with various embodiments disclosed herein include benzoxazines, naphthoxazines, and spiro-oxazines, e.g., spiro(indoline)naphthoxazines, spiro(indoline)pyridobenzoxazines, spiro(benzindoline)pyridobenzoxazines, spiro(benzindoline)naphthoxazines, spiro(indoline)benzoxazines, spiro(indoline)fluoranthenoxazine, and spiro(indoline)quinoxazine.

Examples of thermally reversible photochromic fulgides or fulgimides that can be used in conjunction with various embodiments disclosed herein include: fulgides and fulgimides, which are disclosed in U.S. Pat. No. 4,685,783 at column 1, line 57 to column 5, line 27, the disclosure of which is hereby incorporated herein by reference, and mixtures of any of the aforementioned photochromic materials/compounds.

When the photochromic material comprises at least two photochromic compounds, the photochromic compounds can be linked to one another via linking group substituents on the individual photochromic compounds. For example, the photochromic materials can be polymerizable photochromic compounds or photochromic compounds that are adapted to be compatible with a host material ("compatibilized photochromic materials"). Examples of polymerizable photochromic materials that can be used in conjunction with various embodiments disclosed herein are disclosed in U.S. Pat. No. 6,113,814 at column 2, line 23 to column 23, line 29, which disclosure is hereby incorporated herein by reference. Examples of compatiblized photochromic materials that can be used herein are disclosed in U.S. Pat. No. 6,555,028 at column 2, line 40 to column 25, line 26, which disclosure is hereby incorporated herein by reference. A polymerizable photochromic material that is substantially hydrophilic can be used as the substantially hydrophilic monomer in the polymerizable component. Alternatively, a polymerizable photochromic material that is substantially hydrophobic can be used as the substantially hydrophobic monomer in the polymerizable component.

Other suitable photochromic groups and complementary photochromic groups are described in U.S. Pat. No. 6,080,338 at column 2, line 21 to column 14, line 43; U.S. Pat. No. 6,136,968 at column 2, line 43 to column 20, line 67; U.S. Pat. No. 6,296,785 at column 2, line 47 to column 31, line 5; U.S. Pat. No. 6,348,604 at column 3, line 26 to column 17, line 15; U.S. Pat. No. 6,353,102 at column 1, line 62 to column 11, line 64; and U.S. Pat. No. 6,630,597 at column 2, line 16 to column 16, line 23. The aforesaid disclosures of the aforementioned patents are hereby incorporated herein by reference.

Still further suitable photochromic materials include photochromic-dichroic materials, such as the materials disclosed in U.S. Patent Application Publication No. 20050004361, (now U.S. Pat. No. 7,342,112) from paragraph [0024] to [00157], which disclosure is incorporated herein by reference. Such material can be used to provide polarizing properties to microparticles that are at least partially aligned as described hereinafter. Examples of such photochromic-dichroic compounds include:

(1) 3-phenyl-3-(4-(4-(3-piperidin-4-yl-propyl)piperidino) phenyl)-13,13-dimethyl-indeno[2',3':3,4]-naphtho[1,2-b] pyran;
(2) 3-phenyl-3-(4-(4-(3-(1-(2-hydroxyethyl)piperidin-4-yl) propyl)piperidino)phenyl)-13,13-dimethyl-indeno[2',3':3, 4]naphtho[1,2-b]pyran;
(3) 3-phenyl-3-(4-(4-(4-butyl-phenylcarbamoyl)-piperidin-1-yl)phenyl)-13,13-dimethyl-6-methoxy-7-(4-phenyl-piperazin-1-yl)indeno[2',3':3,4]naphtho[1,2-b]pyran;
(4) 3-phenyl-3-(4-([1,4']bipiperidinyl-1'-yl)phenyl)-13,13-dimethyl-6-methoxy-7-([1,4']bipiperidinyl-1'-yl)indeno [2',3':3,4]naphtho[1,2-b]pyran;
(5) 3-phenyl-3-(4-(4-phenyl-piperazin-1-yl)phenyl)-13,13-dimethyl-6-methoxy-7-(4-(4-hexylbenzoyloxy)-piperidin-1-yl)indeno[2',3':3,4]naphtho[1,2-b]pyran; or
(6) mixtures of such pyrans.

In addition to the aforementioned photochromic materials, an example of non-thermally reversible diarylethene photochromic material is described in U.S. Patent Application 2003/0174560 from paragraph [0025] to [0086], and a non-thermally reversible fulgide or fungimide is described in U.S. Pat. No. 5,631,382 at column 2, line 35 to column 12, line 8, which disclosures are hereby incorporated herein by reference.

In certain embodiments, the photosensitive material is a photochromic material comprising a pyran chosen from:
(a) 3,3-di(4-methoxyphenyl)-6,11,13-trimethyl-13-(2-(2-(2-hydroxyethoxy)ethoxy)ethoxy)-3H,13H-indeno[2', 3':3, 4]naphtho[1,2-b]pyran;
(b) 3-(4-methoxyphenyl)-3-(4-(2-hydroxyethoxy)phenyl)-13,13-dimethyl-3H,13H-indeno[2',3':3,4]naphtho[1,2-b] pyran;
(c) 3-(4-methoxyphenyl)-3-(4-(2-hydroxyethoxy)phenyl)-6, 7-dimethoxy-11-trifluoromethyl-13,13-dimethyl-3H, 13H-indeno[2',3':3,4]naphtho[1,2-b]pyran;
(d) 3,3-di(4-methoxyphenyl)-13,13-dimethyl-3H,13H-indeno[2',3':3,4]naphtho[1,2-b]pyran;
(e) 3-(4-methoxyphenyl)-3-(4-(2-hydroxyethoxy)phenyl)-6, 11-difluoro-13,13-dimethyl-3H,13H-indeno[2',3':3,4] naphtho[1,2-b]pyran; or
(f) mixtures of such pyrans.

Methods of making photochromic materials with and without at least one polymerizable group are well known to those skilled in the art. For example, and without limitation, 3,3-di (4-methoxyphenyl)-6,11,13-trimethyl-13-(2-(2-(2-hydroxy-ethoxy)ethoxy)ethoxy-3H,13H-indeno[2',3':3,4]naphtho[1, 2-b]pyran (Photochromic Material A), can be prepared by following the process of Example 8 of U.S. Pat. No. 6,113,814, which example is incorporated herein by reference, except that in Step 7 of the process, triethylene glycol is used in place of diethylene glycol.

A photochromic material such as (b) 3-(4-(2-hydroxy-ethoxy)phenyl)-3-(4-methoxyphenyl)-13,13-dimethyl-3H, 13H-indeno[2',3':3,4]naphtho[1,2-b]pyran (Photochromic Material B), can be prepared by reacting 7,7-dimethyl-5-hydroxy-7H-benzo[C]fluorene with 1-(4-(2-hydroxyethoxy) phenyl)-1-(4-methoxyphenyl)-2-propyn-1-al using procedures known to those skilled in the art.

A photochromic material such as (c) 3-(4-methoxyphenyl)-3-(4-(2-hydroxyethoxy)phenyl)-6,7-dimethoxy-11-trifluoromethyl-13,13-dimethyl-3H,13H-indeno[2',3':3,4] naphtho[1,2-b]pyran (Photochromic Material C) can be prepared following the procedure of Example 1 in U.S. Patent Application Publication 2008/0103301 except that 1-(4-(2-hydroxyethoxy)phenyl)-1-(4-methoxyphenyl)-2-propyn-1-ol would be used in place of 1,1-bis(4-methoxyphenyl)-2-propyn-1-ol in Step 6, which example is hereby incorporated herein by reference.

A photochromic material such as (d) 3,3-di(4-methoxyphenyl)-6,11-dimethoxy-13-butyl-13-(2-hydroxyethoxy)-3H,13H-indeno[2',3':3,4]naphtho[1,2-b]pyran (Photochromic Material D), can be prepared by using the same process as described above for Photochromic Material A, except that 3,3-di(4-methoxyphenyl)-6,11-dimethoxy-13-butyl-13-hydroxy-3H,13H-indeno[2',3':3,4]naphtho[1,2-b]pyran and ethylene glycol are reacted together in Step 7 of Example 8 of U.S. Pat. No. 6,113,814.

A photochromic material such as (e) 3-(4-methoxyphenyl)-3-(4-(2-hydroxyethoxy)phenyl)-6,1'-difluoro-13,13-dimethyl-31-1,13H-indeno[2',3':3,4]naphtho[1,2-b]pyran (Photochromic Material E), can be prepared by following the procedure of Example 1 of U.S. Pat. No. 7,556,751 B2 except that 1-(4-(2-hydroxyethoxy)phenyl)-1-(4-methoxyphenyl)-2-propyn-1-ol would be used in place of 1,1-bis(4-methoxyphenyl)-2-propyn-1-ol in Step 5, which example is hereby incorporated herein by reference.

A photochromic material such as 3,3-di(4-methoxyphenyl)-6-methoxy-7-morpholino-13-ethyl-13-(2-(2-hydroxy-ethoxy)ethoxy)-3H,13H-indeno[2',3':3,4]naphtho[1,2-b]pyran can be prepared by reacting 2-morpholino-3-methoxy-5, 7-dihydroxy-7-ethyl-7H-benzo[C]fluorene, which can be prepared by following Step 2 of Example 9 of U.S. Pat. No. 6,296,785 using the appropriately substituted starting material (which example is hereby incorporated herein by reference) with 1,1-bis(4-methoxyphenyl)-2-propyn-1-ol, which can be prepared by following the method of Step 1 of Example 1 of U.S. Pat. No. 5,458,814 (which example is hereby incorporated herein by reference) using procedures known to those skilled in the art.

Similarly, a photochromic material such as 3-(4-fluorophenyl)-3-(4-methoxyphenyl)-6,7-dimethoxy-13-ethyl-13-(2-(2-hydroxyethoxy)ethoxy)-3H,13H-indeno[2',3':3,4]naphtho[1,2-b]pyran, can be prepared by following the process used for Photochromic Material A except by using 3-(4-fluorophenyl)-3-(4-methoxyphenyl)-6,7-dimethoxy-13-ethyl-13-hydroxy-3H,13H-indeno[2',3':3,4]naphtho[1,2-b] pyran and diethylene glycol in the process.

A photochromic material such as 3,3-di(4-methoxyphenyl)-6,11,13-trimethyl-13-hydroxy-3H,13H-indeno[2',3':3, 4]naphtho[1,2-b]pyran, can be prepared by following the method of Example 5 of U.S. Pat. No. 5,645,767, which example is incorporated herein by reference.

The photosensitive materials described herein can be chosen from a variety of materials. Examples include: a single photosensitive compound; a mixture of photosensitive compounds; a material comprising at least one photosensitive compound, such as a polymeric resin or an organic monomeric solution; a material such as a monomer or polymer to which at least one photosensitive compound is chemically bonded; a photosensitive polymer, e.g., a photochromic polymer comprising photochromic compounds bonded together; or mixtures thereof.

When the photosensitive material is an organic photochromic material comprising at least one polymerizable group and the copolymerizable material is present, the polymerizable component typically comprises from 2 to 25 weight percent of substantially hydrophilic prepolymer, from 2 to 25 weight percent of substantially hydrophobic prepolymer, from 1 to 45 weight percent of the photochromic material and from 5 to 95 weight percent of one or more copolymerizable monomers, based on the total weight of solids of the polymerizable component being 100 percent. More particularly, the polymerizable component may comprise from 10 to 25 weight percent of substantially hydrophilic prepolymer, from 10 to 25 weight percent of substantially hydrophobic prepolymer, from 5 to 15 weight percent of the photochromic material and from 35 to 75 weight percent of one or more copolymerizable monomers. The individual components of the polymerizable component can each range in all numerical amounts between any combination of their respective ranges inclusive of the aforestated ranges. In certain embodiments, the organic photochromic is present in an amount of up to 50 weight percent of the total weight of solids of the polymerizable component.

Further examples of the present invention include at least partially crosslinked photosensitive polymeric microparticles comprising an at least partially polymerized component comprising integral surface and interior domains wherein said surface domain comprises at least one substantially hydrophilic region, said interior domain comprises at least one substantially hydrophobic region, and at least one of said surface and/or interior domains is photosensitive. In certain instances, the surface and/or interior domain that is photosensitive comprises an effective amount of at least one photosensitive material chosen from fluorescent materials, phosphorescent materials, nonlinear optical materials, photochromic materials or mixtures thereof. Often, the interior domain is adapted to be photosensitive. The photosensitive material may be substantially non-extractable and in particular instances, the photosensitive material is a photochromic material.

The at least partially crosslinked polymeric microparticles are formed by the self-assembly and partial polymerization of the polymerizable component in an aqueous environment. During self-assembly of the microparticles, the substantially hydrophilic regions orient to the exterior and form the surface domain and the substantially hydrophobic regions orient to the interior and form the interior domain. As used herein the terms "surface domain" means the contiguous region of the outside of the microparticles (shell) and "interior domain" comprises the contiguous region of the inside of the microparticles (core), all of which domains are integral.

The at least one photosensitive material is often adapted to be substantially non-extractable. The non-extractable photosensitive material is also often a photochromic material. The photochromic material is typically an organic photochromic material and can be substituted with at least one polymerizable group. By substantially non-extractable is meant that a microparticle of substantially non-extractable photosensitive material will release less photosensitive material than a microparticle of an identical photosensitive material that is substantially extractable since measures to prevent extraction were not taken, e.g., providing the photosensitive material with at least one polymerizable group capable of reacting with the polymerizable component as described hereinafter.

The relative extractability of photosensitive materials from the photosensitive polymeric microparticles (using organic photochromic materials as an example) can be tested by including an effective amount of the photochromic polymeric microparticles of a substantially non-extractable photochromic material, such as Photochromic A described herein before, which has at least one polymerizable group capable of reacting with the polymerizable component, in one portion of a coating composition of the film-forming type used in the examples and including an effective amount of photochromic polymeric microparticles of a substantially extractable photochromic material, such as Photochromic F described herein before, which does not have a polymerizable group capable of reacting with the polymerizable component, in another portion of the coating composition. The term "effective amount" in this illustration means that a sufficient amount of photochromic polymeric microparticles are used to produce a photochromic effect discernible to the naked eye upon activation. The coating compositions containing each type of photochromic polymeric microparticles are applied as at least partial coatings to lenses and at least partially cured as described in the examples herein. The at least partially cured coated lenses as well as an uncoated lens of the same material are each measured for their absorbance at a suitable wavelength, e.g., 390 nanometers (nm), to measure the initial amounts of photochromic materials as well as the absorbance of the lens material. The absorbance of the uncoated lens is subtracted from the absorbance of each of the coated lenses to account for the ultraviolet stabilizers typically present in such lens material. The coated lenses as well as an uncoated lens are immersed in separate containers of equivalent amounts of a solvent in which the photosensitive material is at least partially soluble, such as tetrahydrofuran (THF) which solvent is maintained at 23° C., e.g., room temperature. At intervals of 30 minutes, each of the lenses is removed, dried and tested for their absorbance at 390 nm and the absorbance of the uncoated lens is subtracted from each of the at least partially coated lenses. This is continued until the absorbance readings for the coated lenses do not significantly change indicating that the extractable amount of photochromic material has been extracted.

Regarding the photosensitive polymeric microparticles of the present invention, the amount of substantially non-extractable photosensitive material released from the photosensitive polymeric microparticles in comparison to the amount of extractable photosensitive material released by the photosensitive polymeric microparticles can vary from slightly less to significantly less. Stated another way, microparticles containing substantially non-extractable photosensitive materials can release from 10% less to 100% less photosensitive material than the microparticles containing extractable photochromic materials.

The photosensitive material can be made substantially non-extractable by trapping due to its being trapped within the resulting polymeric network of the at least partially crosslinked polymeric microparticle as a result of the size of the photosensitive material; for example, a particulate photosensitive material, e.g., a glass particulate comprising inorganic photochromic materials, or a photochromic oligomer or photochromic polymer having a number average weight and/or configuration which would be expected to be trapped by size. Alternatively, the photosensitive material may be at least partially bound to the polymeric network by covalent bonds, e.g., by at least one functional group reactive with the surface and/or interior domains. The photosensitive material may also be held by a combination of factors including physical size, hydrogen bonding and covalent bonding.

It has been observed that substantially non-extractable organic photosensitive materials, e.g., organic photochromic materials, remain in the physical phase in which they were added. For example, the substantially non-extractable organic photochromic materials associated with the substantially hydrophobic region of the interior domain do not tend to migrate into the substantially hydrophilic region of the surface domain and crystallize.

The size of the photosensitive polymeric microparticles of the present invention can vary widely. For example, the size of the microparticles of the present invention can range from an average particle size, e.g., a volume average particle size as determined by a laser diffraction particle size instrument that measures the size of the particles assuming that each particle has a spherical shape, yielding a "particle size" referring to the diameter of the smallest sphere that will completely enclose the particle, of from 10 to 10,000 nanometers (nm) or from 20 to 5000 nm or from 30 to 1500 nm or from 40 to 1000 nm or from 50 to 500 nm or from 60 to 200 nm. The average particle size of the photosensitive polymeric microparticles have a range that varies between any of the aforementioned values, inclusive of the recited values, e.g., from 40 to 120 nm.

When the average particle size of the photosensitive polymeric microparticles is less than 50 nm, the size can be determined by ultraviolet or X-ray-laser scattering methods, atomic force microscopy, neutron scattering or other methods known to those skilled in the art. When the average particle size is greater than 50 nanometers and up to 1000 nm, the average particle size can be measured according to known visible-laser scattering techniques or it can be determined by visually examining an electron micrograph of a transmission electron microscopy ("TEM") image, measuring the diameter of the particles in the image, and calculating the average particle size based on the magnification of the TEM image. When the average particle size is greater than 1000 nm, the size can be measured by using light microscope methods known to those skilled in the art.

The aforementioned photosensitive polymeric microparticles can comprise functionality that can react with crosslinking materials. Such functionality also enables the photosensitive polymeric microparticles to react with components of host materials, e.g., polymeric organic materials, to make the photosensitive polymeric microparticles more compatible with the host. By the term "more compatible" is meant that the combination of the photosensitive polymeric microparticles and host material would be less likely to demonstrate cloudiness or haze, which is a typical indication of a lack of compatibility. In one example of the present invention, at least a portion of the functionality adapted to react is hydrophilic for example, hydroxyl and carboxyl functional groups. Examples of functional groups include: hydroxyl, carboxyl, epoxy, carbamate, amino, mercapto, amide and/or urea groups.

In regards to the crosslinking materials, the crosslinking materials are often chosen from: materials comprising two or more sites of reactive unsaturation; materials comprising two or more of the aforementioned functional groups; materials comprising one or more sites of reactive unsaturation and one or more of the aforementioned functional groups: or mixtures of such crosslinking materials. Examples of crosslinking materials for hydroxyl, carboxyl, amide, and carbamate functional group containing materials include aminoplast resins, phenoplast resins or mixtures thereof. Examples of aminoplast resins are commercially available from CYTEC Industries, Inc., under the trademark CYMEL, e.g., CYMEL® 327, 328, 345, 350, 370 and 385 and from Monsanto Chemical Co. under the trademark RESIMENE Polyisocyanates and blocked polyisocyanates and polyaziridines can be used as crosslinking materials for hydroxyl and primary and/or secondary amino group-containing materials. Examples of polyisocyanates and blocked isocyanates suitable for use as crosslinking agents for the photosensitive microparticles of the present invention are those described in U.S. Pat. No. 4,546,045 at col. 5, lines 16 to 38; and in U.S. Pat. No. 5,468,802 at col. 3, lines 48 to 60, which disclosures are hereby incorporated herein by reference.

Examples of crosslinking materials for hydroxyl and primary and/or secondary amino groups include anhydrides that are well known in the art. Examples of anhydrides suitable for use as crosslinking materials are those described in U.S. Pat. No. 4,798,746 at col. 10, lines 16 to 50; and in U.S. Pat. No. 4,732,790 at col. 3, lines 41 to 57, which disclosures are hereby incorporated herein by reference.

Examples of crosslinking materials for carboxyl functional groups include polyepoxides and carbodiimides, such as the materials sold under the trademark CARBODILITE that are manufactured by Nisshinbo Industries, Inc of Japan.

Examples of crosslinking materials for epoxy functional group containing materials are polyacids that are well known in the art. Examples of polyacids suitable for use as crosslinking materials are those described in U.S. Pat. No. 4,681,811 at col. 6, line 45 to col. 9, line 54, which disclosure is hereby incorporated herein by reference.

Examples of crosslinking materials for carbonates and unhindered esters include polyamines that are well known in the art. Examples of polyamines suitable for use as crosslinking materials for the photosensitive polymeric microparticles of the present invention are those described in U.S. Pat. No. 4,046,729 at col. 6, line 61 to col. 7, line 26, which disclosure is hereby incorporated herein by reference.

Examples of crosslinking materials for hydroxyl functional group containing materials include siloxanes, silanes and/or hydrolysates of each that are typical components of hardcoat producing coating solutions such as Hi-Gard® coating solutions, sold by PPG Industries, Inc. Further examples include silyl substituted materials such as tris[3(trimethoxysilyl)propyl]isocyanurate, which are well known in the art.

When desired and appropriate, mixtures of the aforementioned crosslinking materials can be used.

In a series of further embodiments, reactivity with crosslinking materials and additional physical properties, such as those described hereinafter, can be associated with the photosensitive polymeric microparticles of the present invention. The microparticles can be adapted to have these properties by incorporation of materials conferring such properties during the formation of the polymerizable component and/or after formation of the at least partially crosslinked photosensitive polymeric microparticles.

The photosensitive polymeric microparticle is rendered magnetic or magnetically responsive by the introduction of magnetic materials and/or magnetically responsive metal oxides during and/or after preparation of the microparticles. Examples of such materials include superparamagnetic metal oxides, paramagnetic metal oxides, ferromagnetic metal oxides, e.g. ferrite, or mixtures thereof, as known by those skilled in the art. Magnetic particulates are commercially available from Dynal Biotech or can be prepared using art-recognized methods, such as those disclosed in, for example, U.S. Pat. No. 4,358,388 at column 1, line 42 to column 7, line 39, and U.S. Pat. No. 5,356,713 at column 1, line 47 to column 5, line 12, which disclosures are hereby incorporated herein by reference.

The photosensitive polymeric microparticles can be electrically conductive by incorporating electrically conductive materials into the photosensitive polymeric microparticles. Electrically conductive fillers, such as carbon fillers, carbon blacks or metal fibers can be incorporated during and/or after preparation of the microparticles. The amount of electrically conductive material added can vary widely provided that the percolation threshold, e.g., the concentration of filler at which the microparticles will conduct an electrical current, is met or exceeded. Electrically conductive polymers can also be incorporated into the microparticle by including monomers of such polymers in the polymerizable component. Examples of conductive polymers include: polyaniline-based polymers, polypyrrole-based polymers, polythiophene-based polymers, polyethyleneoxide-based polymers or copolymers thereof. The preparation and use of electrically conductive materials can be accomplished using techniques well known to those skilled in the art. See *Kirk Othmer Encyclopedia of Chemical Technology*, Fourth Edition, Volume 9, "Electrically Conductive Polymers," pages 61-88, which disclosure is hereby incorporated herein by reference.

Coloration can be incorporated within the photosensitive polymeric microparticles by the introduction of non-photosensitive dyes and/or pigments into the polymerizable component and/or microparticles to make the microparticles chromatic. Examples of non-photosensitive dyes and pigments include a wide variety of organic or inorganic materials known to those skilled in the art. Examples of non-photosensitive dyes include fixed tints such as soluble and dispersible tints. Examples of pigments include organic metal oxides, and powders and organic pigments such as animal, vegetable or synthetic pigments. The aforementioned non-photosensitive organic dyes and pigments can also be polymerizable as discussed hereinafter using dichroic materials as an example.

Examples of organic pigments, include quinacridones, phthalocyanines, isoindolines, anthrapyrimidines, anthanthrones, flavanthrones, perinones, pyranthrones, substituted derivatives thereof, and mixtures thereof. Examples of inorganic pigments include titanium dioxide, iron oxide, chromium oxide, lead chromate, carbon black or mixtures thereof.

The photosensitive polymeric microparticles of the present invention can be made at least partially polarizing by incorporating photochromic-dichroic materials, as previously described, and/or conventional dichroic materials and at least partially aligning them. Dichroic materials are capable of absorbing one of two orthogonal plane polarized components of transmitted radiation more strongly than the other. Thus, dichroic materials are capable of at least partially linearly polarizing transmitted radiation. However, although dichroic materials are capable of preferentially absorbing one of two orthogonal plane polarized components of transmitted radiation, if the molecules of the dichroic compound are not suitably positioned or arranged, no net linear polarization of transmitted radiation will be achieved. That is, due to the random positioning of the molecules of the dichroic material, selective absorption by the individual molecules will cancel each other such that no net or overall linear polarizing effect is achieved. Thus, it is generally necessary to suitably position or arrange, e.g., at least partially align, the molecules of a dichroic material within another material in order to form a conventional linear polarizing element. For example by the stretching of a polymeric sheet to align the dichroic material to produce a linearly polarizing filter or lens for sunglasses, as is known to those skilled in the art.

Examples of suitable conventional dichroic materials include azomethines, indigoids, thioindigoids, merocyanines, indans, quinophthalonic dyes, perylenes, phthaloperines, triphenodioxazines, indoloquinoxalines, imidazotriazines, tetrazines, azo and (poly)azo dyes, benzoquinones, naphthoquinones, anthroquinone and (poly)anthroquinones, anthropyrimidinones, iodine and iodates. The dichroic material can be a polymerizable dichroic material. That is, the dichroic material can comprise at least one polymerizable group. For example, although not limiting herein, the at least one dichroic material can have at least one alkoxy, polyalkoxy, alkyl, or polyalkyl substituent terminated with at least one polymerizable group.

The phrase "subjecting a material to conditions sufficient to at least partially form microparticles", as mentioned in the various methods of producing a non-aqueous dispersion of photosensitive microparticles, includes subjecting the material to high shearing stress conditions to particularize the material into microparticles. The high shearing stress can be accomplished by any of the high shearing stress techniques known to those skilled in the art.

As used herein, the term "high shearing stress conditions" is meant to include not only high shearing stress techniques, such as the liquid-liquid impingement techniques discussed in detail below, but also high speed shearing by mechanical means. It should be understood that, if desired, any mode of applying stress to the aqueous composition can be utilized so long as sufficient stress is applied to achieve particularization of the aqueous composition to form microparticles.

The aqueous composition can be subjected to the appropriate shearing stress conditions by use of a MICROFLUIDIZER® emulsifier which is available from Microfluidics Corporation in Newton, Mass. The MICROFLUIDIZER® high-pressure impingement emulsifier is described in detail in U.S. Pat. No. 4,533,254, which is incorporated herein by reference. The device consists of a high-pressure (up to about $1.4 \times 10^5$ kPa (20,000 psi)) pump and an interaction chamber in which emulsification takes place. In one example, a pre-emulsion of the admixture is prepared prior to subjecting it to high shearing stress. The pump forces the admixture into the chamber where it is split into at least two streams which pass at very high velocity through at least two slits and collide, resulting in the formation of small particles, e.g., the admixture is "particularized".

Each aqueous composition is typically passed through the emulsifier at a pressure of between about $3.5 \times 10^4$ and about $1 \times 10^5$ kPa (5,000 and 15,000 psi) multiple times or until at least partially formed microparticles are produced. Multiple passes of each of the aqueous compositions within the emulsifier can result in microparticles having a smaller average particle size and a narrower range for the particle size distribution. When using the aforesaid MICROFLUIDIZER® emulsifier, stress is applied by liquid-liquid impingement. As mentioned above, other modes of applying stress to the pre-emulsification admixture can be utilized so long as sufficient stress is applied to achieve at least partially formed microparticles which can be further reduced in size by multiple passes. For example, alternative methods of applying high shearing stress conditions would be the use of ultrasonic energy, homogenizers, rotor/stator mixers and/or jet dispersers.

Polymerization of the polymerizable components of the at least partially formed photosensitive polymeric microparticles can be accomplished by irradiating the composition with an initiating amount of radiation and/or adding to the composition an initiating amount of material e.g., an initiator, capable of enabling polymerization to occur by methods such as free radical polymerization, thermal polymerization, photopolymerization or a combination thereof. Methods for polymerizing the materials used to prepare the photosensitive polymeric microparticles of the present invention are well known to the skilled artisan and any of those well known techniques can be used.

For example, the polymerizable components can be at least partially polymerized by thermal polymerization, e.g. at temperatures ranging from 22° C. to 150° C., by photopolymerization or by a combination of the two methods. While a range of temperatures has been described for the thermal polymerization of the polymerizable components in the at least partially formed microparticles, it will be recognized by persons skilled in the art that temperatures other than those disclosed herein may be used.

Methods for initiating polymerization by irradiation include the use of ultraviolet, visible, infrared, microwave, gamma or electron beam radiation so as to initiate the polymerization reaction of the polymerizable components. This can be followed by a thermal step to cure any unreacted polymerizable materials.

Polymerization of the polymerizable components can be done by including in the aqueous composition an initiating amount of material capable of generating free radicals, such as organic peroxy compounds or azobis(organonitrile) compounds, e.g., an initiator. Examples of suitable organic peroxy compounds, that can be used as thermal polymerization initiators include: t-butyl hydroperoxide, peroxymonocarbonate esters, such as tertiarybutylperoxy isopropyl carbonate; peroxydicarbonate esters, such as di(2-ethylhexyl)peroxydicarbonate, di(secondary butyl)peroxydicarbonate and diisopropylperoxydicarbonate; diacylperoxides, such as 2,4-dichlorobenzoyl peroxide, isobutyryl peroxide, decanoyl peroxide, lauroyl peroxide, propionyl peroxide, acetyl peroxide, benzoyl peroxide, p-chlorobenzoyl peroxide; peroxyesters such as t-butylperoxy pivalate, t-butylperoxy octylate, and t-butylperoxyisobutyrate; methylethylketone peroxide, and acetylcyclohexane sulfonyl peroxide. The thermal initiators are preferably those that do not discolor the resulting polymeric microparticle and can participate in an oxidation-reduction initiator system that does not require additional heat, as known to those skilled in the art. See, for example, "Redox Polymerization" by G. S. Misra, Prog. Polym. Sci. Vol 8, pp. 61-131, 1982, which disclosure is incorporated herein by reference.

Examples of suitable azobis(organonitrile) compounds, that can be used as thermal polymerization initiators include: 2,2'-azobis(2,4-dimethylpentanenitrile, 1,1'-azobiscyclohexanecarbonitrile, azobisisobutyronitrile or mixtures thereof.

The amount of thermal polymerization initiator used to initiate and polymerize the polymerizable components can vary and will depend on the particular initiator used. Only that amount that is required to initiate and sustain the polymerization reaction is required. With respect to azobis(organonitrile) compounds, between 0.01 and 5.0 parts of that initiator per 100 parts of the polymerizable components (phm) can be used. Typically, the thermal cure cycle involves heating the polymerizable components in the presence of the initiator to temperatures in a range from room temperature up to 125° C. over a period of from 20 minutes to 2 hours. While a range of time has been described for thermal polymerization of the polymerizable components in the at least partially formed microparticles, it will be recognized by persons skilled in the art that time intervals other than those disclosed herein can be used.

Photopolymerization of the polymerizable components can be carried out in the presence of a photoinitiator using ultraviolet light and/or visible light. Examples of photoinitiators that can be used herein include cleavage-type photoinitiators and abstraction-type photoinitiators.

Examples of cleavage-type photoinitiators include acetophenones, aminoalkylphenones, benzoin ethers, benzoyl oximes, acylphosphine oxides and bisacylphosphine oxides or mixtures of such initiators. A commercial example of such a photoinitiator is DAROCURE® 4265, which is available from Ciba Chemicals, Inc. Examples of abstraction-type photoinitiators include benzophenone, Michler's ketone, thioxanthone, anthraquinone, camphorquinone, fluorone, ketocoumarin or mixtures of such initiators.

Abstraction-type photoinitiators typically function better in the presence of materials such as amines and other hydrogen donor materials added to provide labile hydrogen atoms for abstraction. Typical hydrogen donors have an active hydrogen positioned alpha to an oxygen or nitrogen, e.g., alcohols, ethers and tertiary amines, or an active hydrogen atom directly attached to sulfur, e.g., thiols. In the absence of such added materials, photoinitiation can still occur via hydrogen abstraction from monomers, oligomers or other components of the system.

Cationic photoinitiators can also be used in conjunction with the aforementioned photoinitiators. Examples of cationic initiators used with abstraction type photoinitiators are hydrogen donor materials such as butyryl choline triphenylbutyl borate, or combinations of such materials. Further examples of cationic photoinitiators are onium salts described in U.S. Pat. No. 5,639,802, column 8, line 59 to column 10, line 46, which disclosure is incorporated herein by reference.

The amount of photopolymerization initiator used to initiate and polymerize the polymerizable components of the at least partially formed microparticles can vary and will depend on the particular initiator used. Only that amount that is required to initiate and sustain the polymerization reaction is required. The photopolymerization initiator can be used in amounts of from 0.01% to 5% by weight, based on the weight of polymerizable components.

The light source used for the photopolymerization is selected from those which emit ultraviolet light and/or visible light. The light source can be a mercury lamp, a mercury lamp doped with Fel3 and/or Gal3, a germicidal lamp, a xenon lamp, a tungsten lamp, a metal halide lamp or a combination of such lamps. Typically, the absorbance spectra of the photoinitiator or photoinitiator combination is matched with the spectral output of the bulb, for example, H bulb, D bulb, Q bulb and/or V bulb for highest curing efficiency. The exposure time can vary depending upon the wavelength and intensity of the light source, the photoinitiator, and the polymerizable components. The at least partially formed microparticles can also be at least partially polymerized by using an electron beam process which does not require the presence of an initiator.

A further description of initiators and methods for the polymerization of the polymerizable components in the photosensitive microparticles using thermal and/or photopolymerization methods is disclosed in U.S. Pat. No. 6,602,603 at column 11, line 1 to column 13, line 36, and U.S. Pat. No. 7,001,952 at column 11 line 15 to line 50, which disclosures are incorporated herein by reference.

The present invention also provides a curable, photosensitive film-forming composition prepared from (a) a film-forming component comprising at least one material having reactive functional groups and (b) a non-aqueous dispersion of photosensitive polymeric microparticles such as any of those described above. Such film-forming compositions are often solventborne; suitable solvents include those known in the art of coating formulations, e.g., alcohols, such as butanol; ketones, such as methyl amyl ketone; aromatic hydrocarbons, such as xylene, AROMATIC/SOLVESSO 100, a blend of aromatic solvents available from Exxon Mobil Chemicals; and glycol ethers, such as alkylene glycol monoalkyl or dialkyl ethers; esters such as alkoxyalkyl acetates; and mixtures of any of the foregoing.

The film-forming component (a) may comprise an alkoxide of the general formula $R_xM(OR')_{z-x}$ where R is an organic radical, M is silicon, aluminum, titanium, and/or zirconium, each R' is independently an alkyl radical, z is the valence of M, and x is a number less than z, and may be equal to zero. Such alkoxides are useful in the preparation of sol-gel, i.e., solution-gelation coatings. Examples of suitable organic radicals include, but are not limited to, alkyl, vinyl, methoxyalkyl, phenyl, 3-glycidoxy propyl and 3-methacryloxy propyl. The alkoxide can be further mixed and/or reacted with other compounds and/or polymers known in the art. Particularly suitable are compositions comprising siloxanes formed from at least partially hydrolyzing an organoalkoxysilane. Examples of suitable alkoxide-containing compounds and methods for making them are described in U.S. Pat. Nos. 6,355,189; 6,264,859; 6,469,119; 6,180,248; 5,916,686; 5,401,579; 4,799,963; 5,344,712; 4,731,264; 4,753,827; 4,754,012; 4,814,017; 5,115,023; 5,035,745; 5,231,156; 5,199,979; and 6,106,605. Such alkoxides and the preparation thereof are described in detail in United States Patent Application Publication Number 20060246305, paragraphs [0015] to [0023], incorporated herein by reference. The use of such alkoxides allows for decreased interference and minimal differences in refractive index between the film-forming composition and the substrate, particularly when the substrate is a high refractive index optical grade substrate as discussed below.

Additionally, or alternatively, the film-forming component (a) may comprise any of the crosslinking materials listed above, such as an aminoplast, including self-condensing aminoplasts.

The film-forming component (a) may comprise thermosetting polymeric materials, thermoplastic polymeric materials or a mixture of such polymeric materials. For example, the film-forming component (a) may comprise a thermosetting polymeric material that is chosen from polyurethanes, polyols in combination with capped or free polyisocyanates, poly (urea-urethanes), aminoplast resins, polysiloxanes, polyanhydrides, polyacrylamides, epoxy resins or poly(meth) acrylates, e.g., polymethacrylates, polyacrylates or mixtures thereof. The film-forming component (a) may alternatively comprise one or more different ethylenically unsaturated monomers, curable using actinic radiation such as UV radiation.

When the film-forming component (a) comprises polyols in combination with capped or free polyisocyanates, useful polyisocyanates are numerous and widely varied. Examples can include aliphatic polyisocyanates, cycloaliphatic polyisocyanates wherein one or more of the isocyanato groups are attached directly to the cycloaliphatic ring, cycloaliphatic polyisocyanates wherein one or more of the isocyanato groups are not attached directly to the cycloaliphatic ring, aromatic polyisocyanates wherein one or more of the isocyanato groups are attached directly to the aromatic ring, and aromatic polyisocyanates wherein one or more of the isocyanato groups are not attached directly to the aromatic ring, and mixtures thereof. When an aromatic polyisocyanate is used, generally care should be taken to select a material that does not cause the polyurethane-containing to color (e.g., yellow).

The polyisocyanate can include aliphatic or cycloaliphatic diisocyanates, aromatic diisocyanates, cyclic dimers and cyclic trimers thereof, and mixtures thereof. Examples of suitable polyisocyanates can include Desmodur N 3300 (hexamethylene diisocyanate trimer) which is commercially available from Bayer; Desmodur N 3400 (60% hexamethylene diisocyanate dimer and 40% hexamethylene diisocyanate trimer). Also suitable is Trixene BL 7960, a blocked isocyanate available from Baxenden Chemicals, Ltd. The polyisocyanate can include dicyclohexylmethane diisocyanate and isomeric mixtures thereof. As used herein and the claims, the term "isomeric mixtures" refers to a mixture of the cis-cis, trans-trans, and/or cis-trans isomers of the polyisocyanate. Examples of isomeric mixtures for use in the present invention can include the trans-trans isomer of 4,4'-methylenebis (cyclohexyl isocyanate), hereinafter referred to as "PICM" (paraisocyanato cyclohexylmethane), the cis-trans isomer of PICM, the cis-cis isomer of PICM, and mixtures thereof.

Suitable isomers for use in the present invention include the following three isomers of 4,4'-methylenebis(cyclohexyl isocyanate).

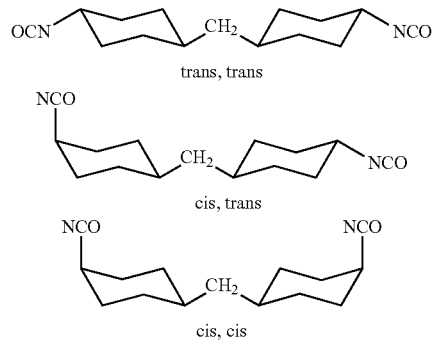

PICM can be prepared by phosgenating 4,4'-methylenebis (cyclohexyl amine) (PACM) by procedures well known in the art such as the procedures disclosed in U.S. Pat. Nos. 2,644, 007; 2,680,127 and 2,908,703; which are incorporated herein by reference. The PACM isomer mixtures, upon phosgenation, can produce PICM in a liquid phase, a partially liquid phase, or a solid phase at room temperature. Alternatively, the PACM isomer mixtures can be obtained by the hydrogenation of methylenedianiline and/or by fractional crystallization of PACM isomer mixtures in the presence of water and alcohols such as methanol and ethanol.

Additional aliphatic and cycloaliphatic diisocyanates that can be used include 3-isocyanato-methyl-3,5,5-trimethyl cyclohexyl-isocyanate ("IPDI") which is commercially available from Arco Chemical, and meta-tetramethylxylene diisocyanate (1,3-bis(1-isocyanato-1-methylethyl)-benzene) which is commercially available from Cytec Industries Inc. under the trade name TMXDI® (Meta) Aliphatic Isocyanate.

As used herein and the claims, the term "aliphatic and cycloaliphatic diisocyanates" refers to 6 to 100 carbon atoms linked in a straight chain or cyclized having two diisocyanate reactive end groups. The aliphatic and cycloaliphatic diisocyanates for use in the present invention can include TMXDI and compounds of the formula $R—(NCO)_2$ wherein R represents an aliphatic group or a cycloaliphatic group.

The polyol in the film-forming component (a) may comprise a compound having at least two active hydrogen groups comprising OH groups and may additionally include primary amine groups, secondary amine groups, thiol groups, and/or combinations thereof. A single polyfunctional compound having only OH groups is typically used; likewise, a single polyfunctional compound having mixed functional groups may be used.

Suitable OH-containing materials for use in the present invention in the preparation of the polyurethane material in the film-forming component can include polyether polyols, polyester polyols, polycaprolactone polyols, polycarbonate polyols, and mixtures thereof.

Examples of polyether polyols are polyalkylene ether polyols which include those having the following structural formula:

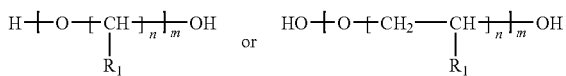

where the substituent R1 is hydrogen or lower alkyl containing from 1 to 5 carbon atoms including mixed substituents, and n is typically from 2 to 6 and m is from 8 to 100 or higher. Included are poly(oxytetramethylene) glycols, poly(oxytetraethylene) glycols, poly(oxy-1,2-propylene) glycols, and poly(oxy-1,2-butylene) glycols. Examples of alkylene oxides can include ethylene oxide, propylene oxide, butylene oxide, amylene oxide, aralkylene oxides, such as but not limited to styrene oxide, mixtures of ethylene oxide and propylene oxide. Polyoxyalkylene polyols can be prepared with mixtures of alkylene oxide using random or step-wise oxyalkylation.

Also useful are polyether polyols formed from oxyalkylation of various polyols, for example, diols such as ethylene glycol, 1,6-hexanediol, Bisphenol A and the like, or other higher polyols such as trimethylolpropane, pentaerythritol, and the like. Polyols of higher functionality which can be utilized as indicated can be made, for instance, by oxyalkylation of compounds such as sucrose or sorbitol. One commonly utilized oxyalkylation method is reaction of a polyol with an alkylene oxide, for example, propylene or ethylene oxide, in the presence of an acidic or basic catalyst. Particular polyethers include those sold under the names TERATHANE and TERACOL, available from E. I. Du Pont de Nemours and Company, Inc., and POLYMEG, available from Q O Chemicals, Inc., a subsidiary of Great Lakes Chemical Corp.

Polyether glycols for use in the present invention can include but are not limited to polytetramethylene ether glycol.

The polyether-containing polyol can comprise block copolymers including blocks of ethylene oxide-propylene oxide and/or ethylene oxide-butylene oxide. Pluronic R, Pluronic L62D, Tetronic R and Tetronic, which are commercially available from BASF, can be used as the polyether-containing polyol material in the present invention.

Suitable polyester glycols can include the esterification products of one or more dicarboxylic acids having from four to ten carbon atoms, such as adipic, succinic or sebacic acids, with one or more low molecular weight glycols having from two to ten carbon atoms, such as ethylene glycol, propylene glycol, diethylene glycol, 1,4-butanediol, neopentyl glycol, 1,6-hexanediol and 1,10-decanediol. The polyester glycols can be the esterification products of adipic acid with glycols of from two to ten carbon atoms.

Suitable polycaprolactone glycols for use in the present invention can include the reaction products of E-caprolactone with one or more of the low molecular weight glycols listed above. A polycaprolactone may be prepared by condensing caprolactone in the presence of a difunctional active hydrogen compound such as water or at least one of the low molecular weight glycols listed above. Particular examples of polycaprolactone glycols include polycaprolactone polyesterdiols available as CAPA® 2047 and CAPA® 2077 from Solvay Corp.

Polycarbonate polyols are known in the art and are commercially available such as Ravecarb™ 107 (Enichem S.p.A.). The polycarbonate polyol can be produced by reacting an organic glycol such as a diol and a dialkyl carbonate, such as described in U.S. Pat. No. 4,160,853. The polyol can include polyhexamethyl carbonate having varying degrees of polymerization.

The glycol material can comprise low molecular weight polyols such as polyols having a molecular weight of less than 500, and compatible mixtures thereof. As used herein, the term "compatible" means that the glycols are mutually soluble in each other so as to form a single phase. Examples of these polyols can include low molecular weight diols and triols. If used, the amount of triol is chosen so as to avoid a high degree of cross-linking in the polyurethane. A high degree of cross-linking can result in a curable polyurethane that is not formable by moderate heat and pressure. The organic glycol typically contains from 2 to 16, or from 2 to 6, or from 2 to 10, carbon atoms. Examples of such glycols can include ethylene glycol, propylene glycol, diethylene glycol, triethylene glycol, tetraethylene glycol, dipropylene glycol, tripropylene glycol, 1,2-, 1,3- and 1,4-butanediol, 2,2,4-trimethyl-1,3-pentanediol, 2-methyl-1,3-pentanediol, 1,3-2,4- and 1,5-pentanedial, 2,5- and 1,6-hexanediol, 2,4-heptanediol, 2-ethyl-1,3-hexanediol, 2,2-dimethyl-1,3-propanediol, 1,8-octanediol, 1,9-nonanediol, 1,10-decanediol, 1,4-cyclohexanediol, 1,4-cyclohexanedimethanol, 1,2-bis(hydroxyethyl)-cyclohexane, glycerin, tetramethylolmethane, such as but not limited to pentaerythritol, trimethylolethane and trimethylolpropane; and isomers thereof.

The OH-containing material can have a weight average molecular weight, for example, of at least 60, or at least 90, or at least 200. Additionally, the OH-containing material can have a weight average molecular weight, for example, of less than 10,000, or less than 7000, or less than 5000, or less than 2000.

The OH-containing material for use in the present invention can include teresters produced from at least one low molecular weight dicarboxylic acid, such as adipic acid.

Polyester glycols and polycaprolactone glycols for use in the present invention can be prepared using known esterification or transesterification procedures as described, for example, in the article D. M. Young, F. Hostettler et al., "Polyesters from Lactone," Union Carbide F-40, p. 147.

Polyester glycols can also be prepared from the reaction of 1,6-hexanediol and adipic acid; 1,10-decandiol and adipic acid; or 1,10-decanediol and caprolactone.

The polyol for use in the present invention can be chosen from: (a) esterification product of adipic acid with at least one diol selected from 1,4-butanediol, 1,6-hexanediol, neopentyl glycol, or 1,10-decanediol; (b) reaction product of E-caprolactone with at least one diol selected from 1,4-butane diol, 1,6-hexane diol, neopentyl glycol, or 1,10-decanediol; (c) polytetramethylene glycol; (d) aliphatic polycarbonate glycols, and (e) mixtures thereof.

Often in the film-forming compositions of the present invention, the photosensitive polymeric microparticles contain functional groups that are reactive with the reactive functional groups in the material in film-forming component (a), allowing the microparticles to become integral to the compositions. Such functional groups may be any of those discussed above.

The film-forming compositions of the present invention may be used to coat substrates and prepare photosensitive coated articles. Such substrates may be optical elements, such as optical memory elements, display elements, ophthalmic elements, window elements or mirror elements.

Upon application to a substrate and curing, the curable film-forming compositions of the present invention often demonstrate a refractive index greater than 1.5, often 1.55 to 1.65, more often 1.58 to 1.60.

The substrate may comprise an at least partially cured polymeric organic material chosen from thermosetting polymeric organic materials, thermoplastic polymeric organic materials or a mixture of such polymeric organic materials. In other embodiments of the present invention, the polymeric organic material is chosen from poly(C1-C12 alkyl methacrylates), poly(oxyalkylene dimethacrylates), poly(alkoxylated phenol methacrylates), cellulose acetate, cellulose triacetate, cellulose acetate propionate, cellulose acetate butyrate, poly(vinyl acetate), poly(vinyl alcohol), poly(vinyl chloride), poly(vinylidene chloride), thermoplastic polycarbonates, polyesters, polyurethanes, polythiourethanes, polysulfithiourethanes, poly(urea-urethane), poly(ethylene terephthalate), polystyrene, poly(alpha methylstyrene), copoly(styrene-methylmethacrylate), copoly(styrene-acrylonitrile), polyvinylbutyral or polymers prepared from bis (allyl carbonate) monomers, polyfunctional acrylate monomers, polyfunctional methacrylate monomers, diethylene glycol dimethacrylate monomers, diisopropenyl benzene monomers, ethoxylated bisphenol A dimethacrylate monomers, ethylene glycol bismethacrylate monomers, poly(ethylene glycol) bismethacrylate monomers, ethoxylated phenol bis methacrylate monomers, alkoxylated polyhydric alcohol polyacrylate monomers, styrene monomers, urethane acrylate monomers, glycidyl acrylate monomers, glycidyl methacrylate monomers, diallylidene pentaerythritol monomers or mixtures of such monomers.

Substrates suitable for use in the preparation of optical elements of the present invention demonstrate a refractive index of at least 1.55 and include nonplastic substrates such as glass. More often, substrates commonly used in optical applications are used, including polyol(allyl carbonate) monomers, e.g., allyl diglycol carbonates such as diethylene glycol bis(allyl carbonate), which monomer is sold under the trademark CR-39 by PPG Industries, Inc; polyurea-polyurethane (polyurea urethane) polymers, which are prepared, for example, by the reaction of a polyurethane prepolymer and a diamine curing agent, a composition for one such polymer being sold under the trademark TRIVEX by PPG Industries, Inc; polyol(meth)acryloyl terminated carbonate monomer; diethylene glycol dimethacrylate monomers; ethoxylated phenol methacrylate monomers; diisopropenyl benzene monomers; ethoxylated trimethylol propane triacrylate monomers; ethylene glycol bismethacrylate monomers; poly (ethylene glycol) bismethacrylate monomers; urethane acrylate monomers; poly(ethoxylated bisphenol A dimethacrylate); poly(vinyl acetate); poly(vinyl alcohol); poly(vinyl chloride); poly(vinylidene chloride); polyethylene; polypropylene; polyurethanes; polythiourethanes; thermoplastic polycarbonates, such as the carbonate-linked resin derived from bisphenol A and phosgene, one such material being sold under the trademark LEXAN; polyesters, such as the material sold under the trademark MYLAR; poly(ethylene terephthalate); polyvinyl butyral; poly(methyl methacrylate), such as the material sold under the trademark PLEXIGLAS, and polymers prepared by reacting polyfunctional isocyanates with polythiols or polyepisulfide monomers, either homopolymerized or co- and/or terpolymerized with polythiols, polyisocyanates, polyisothiocyanates and optionally ethylenically unsaturated monomers or halogenated aromatic-containing vinyl monomers. Also contemplated are copolymers of such monomers and blends of the described polymers and copolymers with other polymers, e.g., to form interpenetrating network products. Typically, the refractive index of the substrate is between 1.55 and 1.67, often 1.55 to 1.65. Thiourethane, polycarbonate, and/or thio-based polyurethane urea are the most commonly used substrates.

Optical elements include: optical memory elements such as devices for optical memory and image processing; ophthalmic elements such as corrective lenses, non-corrective lenses, contact lenses, intra-ocular lenses, magnifying lenses, protective lenses and visors; window elements such as architectural, automotive, motorcycle and aircraft transparencies, filters, shutters, and optical switches; mirror elements; and display elements such as screens, monitors, liquid crystal cells, organic light emitting devices and security elements.

As used herein the term "optical" means pertaining to or associated with light and/or vision. The optical memory elements can include image processing devices and optical data storage devices. In such optical memory elements the interaction of the device with optical signals causes a change in the optical memory of those devices for a period of time until the change in the form of an image is processed or maintained or until the change in the form of information is maintained until further changed or deleted. As used herein the term "ophthalmic" means pertaining to or associated with the eye and vision. Examples of ophthalmic elements include corrective and non-corrective lenses, including single vision or multi-vision lenses, which may be either segmented or non-segmented multi-vision lenses (such as, but not limited to, bifocal lenses, trifocal lenses and progressive lenses), as well as other elements used to correct, protect, or enhance (cosmetically or otherwise) vision, including without limitation, contact lenses, intra-ocular lenses, magnifying lenses, and protective lenses or visors.

As used herein the term "window" means an aperture adapted to permit the transmission of radiation therethrough. Examples of windows include architectural, automotive and aircraft transparencies, filters, shutters, and optical switches. As used herein the term "mirror element" means a surface that specularly reflects a large fraction of incident light. In the present invention, the reflected light can be modified by the type of photosensitive polymeric microparticle connected to the mirror element.

As used herein the term "display" means the visible or machine-readable representation of information in words, numbers, symbols, designs or drawings. Examples of display elements and devices include screens, monitors, liquid crystal cells, organic light emitting devices and security elements. As used herein the term "liquid crystal cell" refers to a structure containing a liquid crystal material that is an anisotropic material capable of being ordered. Active liquid crystal cells are cells wherein the liquid crystal material is capable of being switched between ordered and disordered states or between two ordered states by the application of an external force, such as electric or magnetic fields. Passive liquid crystal cells are cells wherein the liquid crystal material maintains an ordered state. One example of an active liquid crystal cell element or device is a liquid crystal display.

As used herein the term "order" means bring into a suitable arrangement or position, such as by aligning with another structure or material, or by some other force or effect. Thus, as used herein the term "order" encompasses both contact methods of ordering a material, such as aligning with another structure or material, and non-contact methods of ordering a material, such as by exposure to an external force or effect. The term "order" also encompasses combinations of contact and non-contact methods.

Examples of methods of at least partially ordering liquid crystal materials as well as other anisotropic materials such as nonlinear optical materials, photochromic-dichroic materials as well as dichroic dyes, according to various embodiments disclosed herein using liquid crystal material as an example, include exposing at least a portion of the liquid crystal material to at least one of: a magnetic field, an electric field, linearly polarized infrared radiation, linearly polarized ultraviolet radiation, linearly polarized visible radiation and a shear force.

In addition to the aforementioned methods of at least partially ordering a liquid crystal material, the liquid crystal materials can be at least partially ordered by aligning at least a portion of the liquid crystal material with another material or structure, such as an orientation facility. As used herein the term "orientation facility" means a mechanism that can facilitate the positioning of one or more other structures that are exposed, directly and/or indirectly, to at least a portion thereof. Further information on orientation facilities is disclosed in U.S. Pat. No. 108,935 from paragraphs [0153] to [0288] filed May 17, 2004 which disclosure is hereby incorporated herein by reference.

The optical element is often chosen from optical memory elements, display elements, ophthalmic elements, window elements or mirror elements. The display element is often chosen from screens, monitors, liquid crystal cells, organic light emitting devices or security elements. In specific embodiments, the optical element is an organic light emitting device "OLED" wherein the first surface is an anode, the second surface is a cathode and the material positioned there between is an emissive material, said emissive material being in electrical contact with said anode and said cathode.

When a current is applied to the OLED, the anode injects holes and the cathode injects electrons into the emissive material comprising an effective amount of the photosensitive polymeric microparticles of the present invention. The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism as known to those skilled in the art. See, for example, U.S. Pat. No. 6,687,266 at column 2, line 47 to column 18, line 59, which disclosure is hereby incorporated herein by reference. In these instances, the at least partially crosslinked photosensitive polymeric microparticles typically comprise an effective amount of photosensitive materials chosen from fluorescent materials, phosphorescent materials or mixtures thereof.

Examples of security elements include articles having an effective amount of the at least partially crosslinked photosensitive polymeric microparticles of the present invention that are incorporated into and/or connected to at least a portion of at least one surface of the article. The effective amount of photosensitive polymeric microparticles is an amount of such microparticles that enables authentication of the article. The effective amount of photosensitive microparticles can be localized in an authentication mark. Examples of such security elements include without limitation: access cards and passes, e.g., tickets, badges, identification or membership cards, debit cards etc.; negotiable instruments and non-negotiable instruments, e.g., drafts, checks, bonds, notes, certificates of deposit, stock certificates, etc.; government documents, e.g., currency, licenses, identification cards, benefit cards, visas, passports, official certificates, deeds etc.; consumer goods, e.g., software, compact discs ("CDs"), digital-video discs ("DVDs"), appliances, consumer electronics, sporting goods, cars, etc.; credit cards; or merchandise tags, labels and packaging.

The security element can be connected to at least a portion of a substrate chosen from a transparent substrate and a reflective substrate. Alternatively, when a reflective substrate is required, if the substrate is not reflective or sufficiently reflective for the intended application, a reflective material can be first applied to at least a portion of the substrate before the authentication mark is applied thereto. For example, an at least partially reflective aluminum coating can be applied to the at least a portion of the substrate prior to forming the security element thereon. Still further, a security element(s) can be connected to at least a portion of a substrate chosen from untinted substrates, tinted substrates, photochromic substrates, tinted-photochromic substrates, an at least partially linearly polarizing, an at least partially circularly polarizing substrates, and an at least partially elliptically polarizing substrates. In certain instances, the security elements are at least partially linearly polarizing security elements.

Furthermore, the security element can further comprise one or more other coatings or sheets to form a multi-layer reflective security element with viewing angle dependent characteristics as described in U.S. Pat. No. 6,641,874 at column 1, line 6 to column 13, line 28, which is hereby incorporated herein by reference.

As used herein the term "at least partially linearly polarizing" with reference to coatings or substrates refers to coatings or substrates that are adapted to linearly polarize radiation (e.g., confine from some to all of the vibrations of the electric field vector of light waves to one direction). As used herein the term "at least partially circularly polarizing" with reference to coatings or substrates refers to coatings or substrates that are adapted to circularly polarize from some to all of the radiation. As used herein the term "at least partially elliptically polarizing" with reference to coatings or substrates refers to coatings or substrates that are adapted to elliptically polarize from some to all of the radiation. As used herein, the term "photochromic" when used in reference to coatings or substrates, refers to coating or substrate having an absorption spectrum for visible radiation that varies in response to at least actinic radiation. Further, as used herein with reference to substrates, the term "tinted-photochromic" means substrates containing a coloring agent as well as a photochromic material, and having an absorption spectrum for visible, ultraviolet and/or infrared radiation that varies in response to at least actinic radiation. Thus for example, the tinted-photochromic substrate can have a first color characteristic of the coloring agent and a second color characteristic of the combination of the coloring agent and the photochromic material when exposed to actinic radiation.

Methods of applying film-forming compositions of the present invention include those methods known in the art for applying coatings, such as spin coating, spray coating, spray and spin coating, curtain coating, flow coating, dip coating, injection molding, casting, roll coating, wire coating, and overmolding. According to one example, an at least partial coating comprising the photosensitive polymeric microparticles is applied to a mold and the substrate is formed on top of the coating or a preformed substrate is placed on top of the coating, e.g., by overmolding, and the coating is at least partially cured. In this instance, the coating can be applied as a liquid or powder coating comprising the photosensitive polymeric microparticles. Photochromic articles including a polymeric sheet described hereinafter can also be prepared using the overmolding process.

The coated substrate may further comprise additional coating layers such as a primer coating, an abrasion resistant coating, an antireflective coating, a transitional coating interposed between the photosensitive coating and the abrasion resistant coating; an at least partially polarizing polymeric film or coating and combinations thereof.

As noted above, in some cases, a primer coating is applied to the substrate surface prior to application of the curable film-forming composition. The primer coating is interposed between the substrate and the curable film-forming composition, and serves as a barrier coating to prevent interaction of the polymeric coating components with the substrate and vice versa, and/or as an adhesive layer to promote adhesion of the curable film-forming composition to the substrate surface. The primer may be applied to the substrate by any known method, e.g., spray, spin, spread, curtain, roll or dip coating; and may be applied to a cleaned and untreated or cleaned and treated, e.g., chemically treated or plasma treated, surface of the substrate. Primer coatings are well known to those skilled in the art. Selection of an appropriate primer coating will depend on the substrate used, i.e., the primer coating must be chemically and physically compatible with the surface of the substrate and the curable film-forming composition, while providing the functional benefits desired for the primer coating, i.e., barrier and adhesive properties.

The primer coating may be one or several monomolecular layers thick, and can range from 0.1 to 10 microns, more usually from 0.1 to 2 or 3 microns. The thickness of the primer can vary between any combination of the aforementioned values, inclusive of the recited values. One contemplated embodiment of a suitable primer coating comprises an organofunctional silane, such as methacryloxypropyl trimethoxysilane, a catalyst of a material that generates acid on exposure to actinic radiation, e.g., onium salts, and an organic solvent, such as diglyme or isopropyl alcohol, as described in U.S. Pat. No. 6,150,430, which disclosure is incorporated herein by reference.

A further example of a primer coating is described in U.S. Pat. No. 6,025,026, which describes a composition that is substantially free of organosiloxanes and which comprises organic anhydrides having at least one ethylenic linkage and an isocyanate-containing material. Such disclosure is incorporated also herein by reference. After application of the primer, the substrate may be rinsed with an alcohol such as 2-propanol and then water, and dried for up to half an hour at 60° C. to 80° C.

The aforementioned coatings can be connected to at least a portion of the same surface of a substrate in the following order from the surface: primer, photosensitive, transitional, abrasion resistant, polarizing film or coating, antireflective, and abrasion resistant; or primer, photosensitive, transitional, abrasion resistant, and antireflective; or photosensitive, transitional, and polarizing; or primer, photosensitive, and polarizing; or primer, photosensitive, and antireflective. Numerous different combinations of the aforementioned coatings are possible as known by those skilled in the art. All of the aforementioned coatings can be applied to one or more surfaces of a substrate, e.g., both surfaces of an optical substrate. The photosensitive coating is typically applied to one surface. The substrate can be any type of materials described herein as a substrate. In one example, the substrate is an optical element. In a particular example, the optical element is an ophthalmic element.

Examples of primer coatings that can be used herein include coatings comprising coupling agents, at least partial hydrolysates of coupling agents, and mixtures thereof. As used herein "coupling agent" means a material having at least one group capable of reacting, binding and/or associating with a group on at least one surface. A coupling agent can serve as a molecular bridge at the interface of at least two surfaces that can be similar or dissimilar surfaces. Coupling agents can be monomers, pre-polymers and/or polymers. Such materials include organo-metallics such as silanes, titanates, zirconates, aluminates, zirconium aluminates, hydrolysates thereof and mixtures thereof. As used herein the phrase "at least partial hydrolysates of coupling agents" means that at least some to all of the hydrolyzable groups on the coupling agent are hydrolyzed. Other examples of primer coatings that are suitable for use include those primer coatings described U.S. Pat. No. 6,025,026 at column 3, line 3 to column 11, line 40 and U.S. Pat. No. 6,150,430 at column 2, line 39 to column 7, line 58, which disclosures are hereby incorporated herein by reference.

As used herein, the term "transitional coating" means a coating that aids in creating a gradient in properties between two coatings. For example, a transitional coating can aid in creating a gradient in hardness between a relatively hard coating and a relatively soft coating. Examples of transitional coatings include radiation-cured acrylate-based thin films as described in U.S. Pat. No. 7,452,611, which coating disclosure is hereby incorporated herein by reference.

Examples of at least partially abrasion resistant and other protective coatings include abrasion-resistant coatings comprising organosilanes, organosiloxanes, abrasion-resistant coatings based on inorganic materials such as silica, titania and/or zirconia, organic abrasion-resistant coatings of the type that are ultraviolet light curable, oxygen barrier-coatings that improve fatigue resistance of the photosensitive material, UV-shielding coatings, and combinations thereof.

The phrase "an at least partially abrasion resistant coating or sheet" refers to a coating or an at least partial sheet of a protective polymeric material that demonstrates a resistance to abrasion that is greater than a standard reference material, e.g., a polymer made of CR-39® monomer available from PPG Industries, Inc, as tested in a method comparable to ASTM F-735 Standard Test Method for Abrasion Resistance of Transparent Plastics and Coatings Using the Oscillating Sand Method.

The phrase "an at least partially antireflective coating" refers to a coating that at least partially improves the antireflective nature of the substrate to which it is applied by reducing the amount of glare reflected by the surface of the substrate and for transparent substrates by increasing the percent transmittance as compared to an uncoated substrate. Examples of antireflective coatings include a monolayer or multilayer of metal oxides, metal fluorides, or other such materials, which can be deposited onto the articles of the present invention through vacuum evaporation, sputtering, or some other method.

Examples of at least partially linearly polarizing coatings include, but are not limited to, coatings comprising conventional dichroic compounds such as, but not limited to, those discussed previously.

The present invention is more particularly described in the following examples, which are intended as illustrative only, since numerous modifications and variations therein will be apparent to those skilled in the art.

In Section I, Components A through T represent materials that were combined and reacted to produce Examples 1 through 14 of non-aqueous dispersions of photochromic microparticles and Comparative Examples 1 and 2 of aqueous dispersions of photochromic microparticles. In Section II, coating compositions that incorporated the photochromic microparticles of Section I are described as well as the preparation of coated lenses and physical testing performed on the coated lenses. In Section III, photochromic performance testing done on selected coated lenses was described.

All water used in the examples and comparative examples was deionized water. Gel permeation chromatography (GPC) was performed using polystyrene standards with molecular weights being reported in number average molecular weight (Mn) in grams/mole, weight average molecular weight (Mw) in grams/mole, and polydispersity index (PDI). Sonication was performed using a Fischer Scientific Model FS30D sonicator at an output frequency of 42 KHz for the time period indicated. Percent solids test was performed by adding a known amount of the material to an aluminum pan, adding acetone to evenly distribute it over the pan, heating in an oven at 120 C for 1 hour, determining the mass differential from initial weight and calculating the percentage. Percent water analyses were performed by Karl Fischer titrations using a Metrohm 758 KFD Titrino auto-titration system and HYDRANAL®Composite 5K reagent.

Section I—Materials and Methods
Component A—Hydrophilic Urethane Prepolymer

The following materials were added in the order described to a suitably equipped reaction flask such as a fourneck round bottom flask equipped with an electronic temperature probe, mechanical stirrer, condenser, and a heating mantle.

| Charge | Material | Weight in grams |
|---|---|---|
| A | 2,2-dimethylolpropionic acid | 100.6 |
|  | butylated hydroxytoluene | 0.9 |
|  | triphenyl phospite | 0.9 |
|  | dibutyltin dilaurate | 0.9 |
|  | N-methyl pyrrolidinone | 120.0 |
| B | SR495B[1] | 258.3 |
| C | dicyclohexylmethanediisocyanate | 393.0 |
| D | toluene | 376.0 |
|  | diethanolamine | 78.9 |
|  | toluene | 78.9 |

[1]Reported to be a caprolactone acrylate commercially available from Sartomer Company, Inc.

Charge A was stirred in the flask at a temperature of 100° C. until all solids were dissolved. Charge B was added and the mixture was reheated to 80° C. Charge C was added over a 15 minute period and the resulting mixture was held at 80° C. for 3 hours and cooled to below 50° C. Charge 0 was added and the resulting mixture was stirred for 30 minutes at cooled to below 65° C. room temperature. The final product was an extremely viscous clear yellow solution.

Component B—Hydrophilic Urethane Prepolymer

The following materials were added in the order described to a suitably equipped reaction flask.

| Charge | Material | Weight in grams |
|---|---|---|
| A | 2,2-dimethylolpropionic acid | 13.4 |
|  | butylated hydroxytoluene | 0.2 |

-continued

| Charge | Material | Weight in grams |
|---|---|---|
|  | triphenyl phospite | 0.2 |
|  | dibutyltin dilaurate | 0.2 |
|  | N-methyl pyrrolidinone | 13.4 |
| B | Sartomer 495B[1] | 68.9 |
| C | DESMODUR ® N3600[2] | 109.6 |
|  | toluene | 100.6 |
| D | diethanolamine | 21.0 |
|  | toluene | 28.4 |

[2]Reported to be a polyfunctional aliphatic polyisocyanate resin available from Bayer Materials Science LLC.

Charge A was stirred in the flask at a temperature of 55° C. and became a hazy solution. Charge B was added and the mixture was maintained at 55° C. Charge C was added over a 15 minute period and the resulting mixture was held at 55° C. for 1 hour. The mixture was heated to 60° C. and maintained at this temperature for 3 hours before the heating bath was removed. Charge D was added and the resulting mixture was stirred for 75 minutes and cooled to below 50° C. The final product was a clear viscous solution. The percent solids was determined to be 63.32.

Component C—Hydrophilic Urethane Prepolymer

The following materials were added in the order described to a suitably equipped reaction flask.

| Charge | Material | Weight in grams |
|---|---|---|
| A | 2,2-dimethylolpropionic acid | 6.7 |
|  | butylated hydroxytoluene | 0.1 |
|  | triphenyl phospite | 0.1 |
|  | dibutyltin dilaurate | 0.1 |
|  | N-methyl pyrrolidinone | 13.4 |
| B | Sartomer 495B[1] | 34.4 |
|  | toluene | 50.2 |
| C | DESMODUR ® N3600[2] | 54.78 |
| D | diethanolamine | 10.5 |
|  | toluene | 7.51 |

Charge A was stirred in the flask at a temperature of 50° C. and became a hazy solution. Charge B was added and the mixture was maintained at 50° C. Charge C was added over a 15 minute period and the resulting mixture was held at 50° C. for 2.5 hours and the mixture became viscous and clear. The heating bath was removed and the mixture was cooled to room temperature. Charge D was added and the resulting mixture was stirred for 30 minutes. The final product was a clear viscous solution. The percent solids was determined to be 62.39.

Component D—Hydrophilic Urethane Prepolymer

The following materials were added in the order described to a suitably equipped reaction flask.

| Charge | Material | Weight in grams |
|---|---|---|
| A | butanone | 60.0 |
|  | 2,2-dimethylolpropionic acid | 5.4 |
|  | butylated hydroxytoluene | 0.1 |
|  | triphenyl phosite | 0.1 |
|  | dibutyltin dilaurate | 0.1 |
|  | DESMODUR ® N3600[2] | 43.82 |

-continued

| Charge | Material | Weight in grams |
|---|---|---|
| B | Sartomer 495B[1] | 27.6 |
| C | butanone | 11.5 |
| D | diethanolamine | 8.4 |
|   | butanone | 10.0 |

Charge A was added to the reaction flask with stirring. The resulting mixture was heated to reflux (80° C.) and maintained at this temperature for 20 minutes until the mixture became a clear solution. The mixture was cooled to 65° C. and Charge B was added dropwise using an addition funnel. Charge C was used to rinse the addition funnel. The mixture was heated to 75° C. and held at this temperature for 4 hours. The resulting mixture was cooled to below 60° C. and Charge D was added. The mixture was stirred for 30 minutes. An Infrared spectrum of the resulting example showed no measurable isocyanate. The percent solids was 53.51.

Component E—Hydrophilic Urethane Prepolymer

The following materials were added in the order described to a suitably equipped reaction flask.

| Charge | Material | Weight in grams |
|---|---|---|
| A | dimethylolpropionic acid | 24.1 |
|   | triphenyl phospite | 0.4 |
|   | dibutyltin dilaurate | 0.4 |
|   | butylated hydroxytoluene | 0.4 |
|   | N-methyl pyrrolidinone | 28.9 |
| B | Sartomer SR495B[1] | 61.9 |
| C | DESMODUR ® W[3] | 94.3 |
|   | toluene | 103.0 |
| D | diethanolamine | 18.9 |
|   | 1-methoxy-2-propanol | 18.9 |
| E | 1-methoxy-2-propanol | 47.5 |

[3] Reported to be a bis(4-isocyanotocyclohexyl)methane commercially available from Bayer Materials Science LLC.

Charges A, B and C were added sequentially to a suitably equipped reaction flask with stirring. The resulting mixture was heated to 80° C. and maintained at this temperature for 5 hours. The resulting mixture was cooled to 60° C. and Charge B was added. The reaction mixture was cooled and charge C was added. The final product has an acid value on 100 weight percent resin solids of 51, a solids content of 50% and an Mn of 1620 as measured by gel permeation chromatography.

Component F—Hydrophilic Urethane Prepolymer

The following materials were added in the order described to a suitably equipped reaction flask.

| Charge | Material | Weight in grams |
|---|---|---|
| A | dimethylolpropionic acid | 13.4 |
|   | poly(hexamethylene carbonate)diol Average Mn 860 | 86.0 |
|   | triphenyl phospite | 0.2 |
|   | dibutyltin dilaurate | 0.2 |
|   | butylated hydroxytoluene | 0.1 |
| B | isophorone diisocyanate | 66.6 |
|   | methylethyl ketone | 165.0 |
| C | Sartomer SR495B[1] | 34.4 |
|   | methylethyl ketone | 20.0 |

| Charge | Material | Weight in grams |
|---|---|---|
| D | diethanolamine | 10.5 |
|   | 1-methoxy-2-propanol | 10.5 |
| E | 1-methoxy-2-propanol | 14.9 |

Charges A and B were sequentially added to a suitably equipped reaction flask with stirring. The resulting mixture was heated to 60° C. and charge C was added over 15 minutes. The resulting mixture was heated to 80° C. maintained at this temperature for 5 hours. The resulting mixture was cooled to 60° C. and Charge D was added and the reaction mixture was allowed to exotherm to 67° C. The reaction mixture was cooled and charge E was added. The final product has an acid value on 100 weight percent resin solids of 27, a solids content of 50% and an Mn of 2290 as measured by gel permeation chromatography.

Component G—Hydrophilic Urethane Prepolymer

The following materials were added in the order described to a suitably equipped reaction flask.

| Charge | Material | Weight in grams |
|---|---|---|
| A | N-methyl pyrrolidinone | 100.6 |
|   | dimethylolpropionic acid | 100.6 |
|   | 4-methyl-2,6-di-tert-butyl-phenol | 0.9 |
|   | triphenyl phospite | 0.9 |
|   | dibutyltin dilaurate | 0.9 |
| B | Sartomer SR495B[1] | 253.8 |
| C | DESMODUR ® W[3] | 393.0 |
| D | toluene | 376.0 |
| E | diethanolamine | 78.9 |
|   | toluene | 78.9 |

Charge A was added sequentially to a suitably equipped reaction flask with stirring. The resulting mixture was heated to 100° C. and Charge B was added. The reaction mixture was cooled to 80° C. and charge C was added slowly while maintaining the reaction mixture at 80° C. for 3 hours. Charge D was added followed by Charge E.

Component H—Hydrophilic Urethane Prepolymer

Step 1—Polycarbonate Acrylate Oligomer

The following materials were added in the order described to a suitably equipped reaction flask.

| Material | Weight in grams |
|---|---|
| hydroxyethyl methacrylate | 32.5 |
| trimethylene carbonate | 229.7 |
| methylhydroquinone | 0.05 |
| methyl ether hydroquinone | 0.05 |
| tin octoate | 0.13 |

The mixture was heated for 20 hours at 120° C. and then cooled. The final product had a solids content of 93.7%, an Mn of 1601 and a Mw of 2127 as measured by gel chromatography.

Step 2—Hydrophilic Urethane Prepolymer

The following materials were added in the order described to a suitably equipped reaction flask.

| Charge | Material | Weight in grams |
|--------|----------|-----------------|
| A | dimethylolpropionic acid | 40.2 |
|   | Product of Step 1 | 105.0 |
|   | triethylamine | 18.2 |
|   | methyl isobutyl ketone | 75.9 |
| B | DESMODUR ® W[3] | 131.0 |
| C | methyl isobutyl ketone | 20.0 |
| D | water | 775.4 |
|   | diethanolamine | 10.5 |
|   | thylenediamine | 3.0 |
|   | dimethylethanolamine | 8.0 |
| E | methyl isobutyl ketone | 20.0 |
| F | dimethylethanolamine | 3.7 |

Charge A was added to a suitably equipped reaction flask with stirring. The mixture was heated to 90° C. for 5 minutes and cooled to 50° C. Charge B was added over 10 minutes followed by charge C as an addition funnel rinse. The reaction mixture was heated to 80° C. and maintained at that temperature for two hours. Charge D was heated in another suitably equipped reaction flask to 60° C. and the mixture resulting from charges A-C was added followed by charge E as a reaction flask rinse. The reaction was cooled and charge F was added. The final product had an acid value number of 13.7, percent solids of 25.0, a pH of 7.68 and a Brookfield viscosity of 1240 cps using spindle #3 at 50 rpm.

Component I—Photochromic Hydrophobic Urethane Prepolymer

The following materials were added in the order described to a suitably equipped reaction flask.

| Charge | Material | Weight in grams |
|--------|----------|-----------------|
| A | toluene | 112 |
| B | DDI ® 1410 diisocyanate[4] | 65.45 |
|   | butylated hydroxytoluene | 0.1573 |
|   | dibutyltin dilaurate | 0.1577 |
| C | Photochromic A[5] | 30.0 |
| D | toluene | 10.7 |
| E | Sartomer SR495B[1] | 64.51 |

[4] Reported to be an aliphatic diisocyanate available from Cognis.
[5] Photochromic A is 3,3-di(4-methoxyphenyl)-6,11,13-trimethyl-13-(2-(2-(2-hydroxyethoxy)ethoxy)ethoxy)-3H,13H-indeno[2',3':3,4]naphtho[1,2-b]pyran.

Charge A was added to a suitably equipped reaction flask. Charge B was added and the mixture was stirred and heated to 90° C. After reaching 90° C., charge C was added via an addition funnel and charge D was used to rinse the addition funnel. Upon completion of the addition, the resulting mixture was maintained at 90° C. for 1.5 hours. The mixture was cooled to 80° C. Charge E was added with air bubbling into the mixture via a needle. The resulting mixture was heated to 80° C. for an hour. After cooling, the final product was transferred to a glass jar. The arithmetic average of the percent solids for four batches was 51.1%.

Component J—Photochromic Hydrophobic Urethane Prepolymer

The following materials were added in the order described to a suitably equipped reaction flask.

| Charge | Material | Weight in grams |
|--------|----------|-----------------|
| A | DDI ® 1410 diisocyanate[4] | 88.1 |
|   | dibutyltin dilaurate | 0.52 |
|   | butylated hydroxytoluene | 0.52 |
|   | toluene | 169.0 |
| B | Photochromic A[5] | 40.4 |
|   | toluene | 10.0 |
| C | Sartomer SR495B[1] | 86.7 |
|   | toluene | 20.0 |
| D | toluene | 16.0 |

Charge A was added to a suitably equipped reaction flask and the mixture was stirred and heated to 90° C. After reaching 90° C., charge B was added portionwise over 30 minutes and upon completion of the addition, the resulting mixture was maintained at 90° C. for two hours. The mixture was cooled to 80° C. Charge C was added over 15 minutes and the temperature was maintained at 80° C. for three hours. After cooling, charge D was added. The percent solids was 50.0%.

Component K—Hydrophobic Urethane Prepolymer

Step 1—p-Caprolactone Extended Dye

The following materials were added in the order described to a suitably equipped reaction flask.

| Charge | Material | Weight in grams |
|--------|----------|-----------------|
| A | Photochromic B[6] | 32.5 |
|   | aluminum isopropoxide | 3.5 |
|   | dichloromethane (anhydrous) | 260.0 |
| B | e-caprolactone | 64.8 |
| C | hydrochloric acid (10 weight percent solution) | 35.0 |
| D | dichloromethane (anhydrous) | 120 (mL) |

[6] Photochromic B is 3-(4-methoxyphenyl)-3-(4-(2-hydroxyethoxy)phenyl)-13,13-dimethyl-3H,13H-indeno[2',3':3,4]naphtho[1,2-b]pyran.

Charge A was added to a suitably equipped reaction flask and the mixture was dissolved by sonication for 10 minutes at room temperature. The resulting reaction mixture was placed under nitrogen and charge B was added and the reaction mixture was stirred at 32° C. for 7 hours. The reaction solution was quenched with charge C. Charge D was added and the resulting mixture was stirred at 32° C. for 30 minutes. The reaction mixture separated and the organic layer was recovered and washed with brine (25 grams) and dried and neutralized with sodium bicarbonate (0.5 gram), neutral alumina (3 grams) and magnesium sulfate. The resulting organic layer was filtered through filter paper and the solvent was removed under vacuum. The final product was a dark purple/red oil that had a percent solids of 90+%, an Mn of 1920 grams/mole and PDI of 1.30 as measured by gel chromatography.

Step 2—Hydrophobic Urethane Prepolymer

The following materials were added in the order described to a suitably equipped reaction flask.

| Charge | Material | Weight in grams |
|--------|----------|-----------------|
| A | DDI ® 1410 diisocyanate[4] | 65.1 |
|   | dibutyltin dilaurate | 0.187 |
|   | buthylated hydroxytoluene | 0.07 |
|   | toluene (anhydrous) | 113.0 |

-continued

| Charge | Material | Weight in grams |
|---|---|---|
| B | Product of Step 1 | 95.0 |
|   | toluene (anhydrous) | 95.0 |
| C | Sartomer SR495B[(1)] | 59.1 |
|   | toluene (anhydrous) | 10.0 |

Charge A was added to a suitably equipped reaction flask with stirring. The mixture was heated to 90° C. and Charge B was added over 20 minutes by portions. The resulting mixture was maintained and stirred at 90° C. for 1.5 hours. The reaction mixture was cooled to 80° C. and charge C was added. The resulting mixture was maintained at 80° C. under an air atmosphere and cooled to room temperature. The final product was a dark purple/red viscous solution that had a percent solids of 50.0, an Mn of 2510 and PDI of 1.42 as measured by gel permeation chromatography.

Component L—Hydrophobic Urethane Prepolymer
Step 1—p-Caprolactone Extended Dye

The following materials were added in the order described to a suitably equipped reaction flask.

| Charge | Material | Weight in grams |
|---|---|---|
| A | Photochromic C[(7)] | 70.0 |
|   | aluminum isopropoxide | 6.42 |
|   | dichloromethane (anhydrous) | 525.0 |
| B | e-caprolactone | 131.4 |
| C | 10 weight percent solution of hydrochloric acid | 75.0 |
| D | dichloromethane (anhydrous) | 250 (mL) |

[(7)]Photochromic C is 3-(4-methoxyphenyl)-3-(4-(2-hydroxyethoxy)phenyl)-6,7-dimethoxy-11-trifluoromethyl-13,13-dimethyl-3H,13H-indeno[2',3':3,4]naphtho[1,2-b]pyran.

Charge A was added to a suitably equipped reaction flask and the mixture was dissolved by sonication for 10 minutes at room temperature. The resulting reaction mixture was placed under nitrogen and charge 13 was added and the reaction mixture was stirred at 32° C. for 7 hours. The reaction solution was quenched with charge C. Charge D was added and the resulting mixture was stirred at 32° C. for 30 minutes. The reaction mixture separated and the organic layer was recovered and washed with brine (50 grams) and dried and neutralized with sodium bicarbonate (0.5 gram), neutral alumina (5.0 grams) and magnesium sulfate. The resulting organic layer was filtered through filter paper and the solvent was removed under vacuum. The final product was a dark green oil that had a percent solids of 90+%, an Mn of 1950 grams/mole and PDI of 1.29 as measured by gel chromatography.

Step 2—Hydrophobic Urethane Prepolymer

The following materials were added in the order described to a suitably equipped reaction flask.

| Charge | Material | Weight in grams |
|---|---|---|
| A | DDI ® 1410 diisocyanate[(4)] | 129.0 |
|   | dibutyltin dilaurate | 0.37 |
|   | butylated hydroxytoluene | 0.13 |
|   | toluene (anhydrous) | 230.0 |

-continued

| Charge | Material | Weight in grams |
|---|---|---|
| B | Product of Step 1 | 210.2 |
|   | toluene (anhydrous) | 210.0 |
| C | Sartomer SR495B[(1)] | 117.2 |
|   | toluene (anhydrous) | 10.0 |

Charge A was added to a suitably equipped reaction flask with stirring. The mixture was heated to 90° C. and Charge B was added over 20 minutes by portions. The resulting mixture was maintained and stirred at 90° C. for 1.5 hours. The reaction mixture was cooled to 80° C. and charge C was added. The resulting mixture was maintained at 80° C. under an air atmosphere and cooled to room temperature. The final product was a dark green slightly viscous solution that had a percent solids of 50.0, an Mn of 2100 and PDI of 1.49 as measured by gel permeation chromatography.

Component M—Hydrophobic Urethane Prepolymer
Step 1—p-Caprolactone Extended Dye

The following materials were added in the order described to a suitably equipped reaction flask.

| Charge | Material | Weight in grams |
|---|---|---|
| A | Photochromic D[(8)] | 50.5 |
|   | aluminum isopropoxide | 3.7 |
|   | dichloromethane (anhydrous) | 380.0 |
| B | e-caprolactone | 96.1 |
| C | 10 weight percent solution of hydrochloric acid | 35.0 |
| D | dichloromethane (anhydrous) | 120 (mL) |

[(8)]Photochromic D is 3,3-di(4-methoxyphenyl)-6,11-dimethoxy-13-butyl-13-(2-hydroxyethoxy)-3H,13H-indeno[2',3':3,4]naphtho[1,2-b]pyran.

Charge A was added to a suitably equipped reaction flask and the mixture was dissolved by sonication for 10 minutes at room temperature. The resulting reaction mixture was placed under nitrogen and charge B was added and the reaction mixture was stirred at 32° C. for 7 hours. The reaction solution was quenched with charge C. Charge D was added and the resulting mixture was stirred at 32° C. for 30 minutes. The reaction mixture separated and the organic layer was recovered and washed with brine (15 grams) and dried and neutralized with sodium bicarbonate (0.5 gram), neutral alumina (5.0 grams) and magnesium sulfate. The resulting organic layer was filtered through filter paper and the solvent was removed under vacuum. The final product was a bright green oil that had a percent solids of 90+%, an Mn of 1430 grams/mole and PDI of 1.81 as measured by gel chromatography.

Step 2—Hydrophobic Urethane Prepolymer

The following materials were added in the order described to a suitably equipped reaction flask.

| Charge | Material | Weight in grams |
|---|---|---|
| A | DDI ® 1410 diisocyanate[(4)] | 94.5 |
|   | dibutyltin dilaurate | 0.27 |
|   | butylated hydroxytoluene | 0.94 |
|   | toluene (anhydrous) | 160.0 |

-continued

| Charge | Material | Weight in grams |
|---|---|---|
| B | Product of Step 1 | 160.0 |
|  | toluene (anhydrous) | 160.0 |
| C | Sartomer SR495B[(1)] | 85.7 |
|  | toluene (anhydrous) | 10.0 |

Charge A was added to a suitably equipped reaction flask with stirring. The mixture was heated to 90° C. and Charge B was added over 20 minutes by portions. The resulting mixture was maintained and stirred at 90° C. for 1.5 hours. The reaction mixture was cooled to 80° C. and charge C was added. The resulting mixture was maintained at 80° C. under an air atmosphere for 1 hour and cooled to room temperature. The final product was a bright green slightly viscous solution that had a percent solids of 50.0, an Mn of 2440 and PDI of 1.55 as measured by gel permeation chromatography.

Component N—Hydrophobic Urethane Prepolymer

The following materials were added in the order described to a suitably equipped reaction flask.

| Charge | Material | Weight in grams |
|---|---|---|
| A | Photochromic E[(9)] | 30.0 |
|  | dibutyltin dilaurate | 0.185 |
|  | butylated hydroxytoluene | 0.184 |
|  | toluene (anhydrous) | 105.0 |
| B | DDI ® 1410 diisocyanate[(4)] | 76.9 |
|  | toluene (anhydrous) | 60.0 |
| C | Sartomer SR495B[(1)] | 75.8 |
|  | toluene (anhydrous) | 60.0 |

[(9)]Photochromic E was 3-(4-methoxyphenyl)-3-(4-(2-hydroxyethoxy)phenyl)-6,11-difluoro-13,13-dimethyl-3H,13H-indeno[2',3':3,4]naphtho[1,2-b]pyran.

Charge A was added to a suitably equipped reaction flask with stirring. The mixture was heated to 90° C. and Charge B was added over 20 minutes by portions. The resulting mixture was maintained and stirred at 90° C. for 1.5 hours. The reaction mixture was cooled to 80° C. and charge C was added. The resulting mixture was maintained at 80° C. under an air atmosphere for 1 hour and cooled to room temperature. The final product was a dark purple slightly viscous solution that had a percent solids of 45.0.

Component O—Hydrophobic Urethane Prepolymer
Step 1

The following materials were added in the order described to a suitably equipped reaction flask.

| Charge | Material | Weight in grams |
|---|---|---|
| A | Photochromic A[(5)] | 112.0 |
|  | trimethylenecarbonate | 146.0 |
|  | aluminum isopropoxide | 3.3 |
|  | chloroform | 400 (mL) |
| B | toluene | 200 |
| C | isocyanato ethyl methacrylate | 12.6 |
|  | dibutyltindilaurate | 4 (drops) |

Charge A was added to a suitably equipped reaction flask. The reaction mixture was stirred under a nitrogen atmosphere for 48 hours. Afterwards the resulting mixture was washed with dilute hydrochloric acid, 10 weight percent sodium bicarbonate solution and dried over magnesium sulfate. After filtration of the magnesium sulfate, the resulting solution was vacuum dried at 90 C for 1 hour. Charge B was added and the mixture was stirred. Charge C was added and the resulting mixture was maintained at 76° C. for 3 hours under a nitrogen atmosphere.

Component P—Hydrophobic Urethane Prepolymer

The procedure used to produce Component O was followed except that 53.6 grams of Photochromic A was used in place of 112.0 grams.

Component Q—Photochromic Hydrophobic Urethane Methacrylate

To a 1 liter suitably equipped reaction flask the following materials were added:

| Charge | Material | Weight in grams |
|---|---|---|
| A | Photochromic A[(5)] | 26.8 |
|  | trimethylenecarbonate | 72.0 |
|  | chloroform (anhydrous) | 200 (mL) |
|  | aluminum isopropoxide | 1.65 |
| B | toluene (anhydrous) | 100 |
| C | dibutyltindilaurate | 2 (drops) |
|  | isocyanate ethyl methacrylate | 6.3 |

Charge A was added and the reaction flask was purged with nitrogen, capped with a rubber septum heated to 35° C. with mixing and maintained at that temperature for 3.5 hours. The resulting dark purple solution was washed with chloroform (200 mL) and a solution of hydrochloric acid (8 grams of conc. HCl in 200 grams of water). The aqueous phase separated and was removed and the organic phase was washed with 200 mL of 10 weight percent aqueous sodium bicarbonate solution. The resulting organic phase was dried with magnesium sulfate, filtered and added to a rotary evaporation flask. After rotary evaporation for 1 hour at 90° C., Charge B was added to the dark purple oil and then Charge C was added. The resulting mixture was heated to 76° C., purged with nitrogen, capped with a rubber septum and stirred for 3 hours at 76° C. Afterwards, the reaction mixture was cooled to room temperature and stirred for about 12 hours.

Component R

The following materials were added in the order described to a suitably equipped reaction flask.

| Charge | Material | Weight in grams |
|---|---|---|
| A | DDI ® 1410 diisocyanate[(4)] | 17.8 |
|  | dibutyltin dilaurate | 0.042 |
|  | butylated hydroxytoluene | 0.042 |
|  | toluene | 10.0 |
| B | Photochromic C[(7)] | 8.0 |
|  | toluene | 55.0 |
| C | Sartomer SR495B[(1)] | 17.6 |
|  | toluene | 10.0 |

Charge A was added to a suitably equipped reaction flask and the mixture was stirred and heated to 90° C. After reaching 90° C., charge B was added portionwise over 20 minutes and upon completion of the addition, the resulting mixture was maintained at 90° C. for 1.5 hours. The mixture was cooled to 80° C. Charge C was added over 15 minutes and the temperature was maintained at 80° C. for one hour in an air atmosphere. The percent solids was 50.0.

Component S

The procedure for preparing Component R was followed using the materials listed below to produce a final product having 50% solids.

| Charge | Material | Weight in grams |
|---|---|---|
| A | Photochromic C[7] | 15.0 |
|  | dibutyltin dilaurate | 0.079 |
|  | butylated hydroxytoluene | 0.079 |
|  | toluene | 95.3 |
| B | DDI ® 1410 diisocyanate[4] | 32.8 |
|  | toluene | 9.0 |
| C | Sartomer SR495B[1] | 32.4 |
|  | toluene | 8.0 |

Component T

The procedure for preparing Component R was followed using the materials listed below to produce a final product having 50% solids.

| Charge | Material | Weight in grams |
|---|---|---|
| A | Photochromic C[7] | 30.0 |
|  | dibutyltin dilaurate | 0.185 |
|  | butylated hydroxytoluene | 0.185 |
|  | toluene | 105.0 |
| B | DDI ® 1410 diisocyanate[4] | 76.9 |
|  | toluene | 60.0 |
| C | Sartomer SR495B[1] | 75.8 |
|  | toluene | 60.0 |

EXAMPLE 1

The following materials were added in the order described as follows.

| Charge | Material | Weight in grams |
|---|---|---|
| A | Component A | 10.0 |
|  | butylacrylate | 5.4 |
|  | dimethylethanolamine | 0.337 |
|  | water | 60.0 |
|  | Component I | 15.023 |
|  | toluene | 4.4 |
| B | water | 5.45 |
|  | ferrous ammonium sulfate (1 wt. percent aqueous solution) | 0.08 |
|  | t-butylhydroperoxide | 0.04 |
| C | water | 4.6 |
|  | sodium metabisulfite | 0.05 |
| D | propylene glycol | 31.0 |

A pre-emulsion was prepared by stirring Charge A in a glass beaker. This pre-emulsion was sonicated at room temperature for 10 minutes. The pre-emulsion was cycled eight times through a Microfluidizer® M-110P at 12,500 psi. The Microfluidizer® M-110P is available from the Microfluidics™ division of MFIC Corporation, Newton, Mass. Cooling water was not used during the recycling of the pre-emulsion. The resulting temperature of the pre-emulsion was about 20-27° C. Charge B was added over 10 minutes followed by the addition of Charge C. The resulting milky purple dispersion was transferred to a rotary evaporation flask and Charge D was added. The resulting dispersion was evaporated until water was no longer collected and a constant weight was obtained. The solids was determined to be 29.22%.

EXAMPLE 2

The procedure of Example 1 was followed except that the pre-emulsion was circulated 4 times instead of 8 and the materials listed below were used to produce a milky purple dispersion having a solids level of 30.14%.

| Charge | Material | Weight in grams |
|---|---|---|
| A | Component B | 13.0 |
|  | butylacrylate | 8.0 |
|  | dimethylethanolamine | 0.24 |
|  | water | 108.0 |
|  | Component I | 20.5 |
|  | toluene | 12.5 |
| B | water | 12.0 |
|  | ferrous ammonium sulfate (1 wt. percent aqueous solution) | 0.10 |
|  | t-butylhydroperoxide | 0.05 |
| C | water | 20.0 |
|  | sodium metabisulfite | 0.06 |
| D | propylene glycol | 39.0 |

EXAMPLE 3

The procedure of Example 1 was followed except that the pre-emulsion was sonicated for 5 minutes instead of 10 and circulated 6 times instead of 8 with cooling water added to the external bath to maintain the pre-emulsion temperature from 20-27° C. and the materials listed below were used to produce a milky purple dispersion having a solids level of 31.55% and percent water of 9.79%.

| Charge | Material | Weight in grams |
|---|---|---|
| A | Component C | 40.0 |
|  | butylacrylate | 21.6 |
|  | dimethylethanolamine | 0.728 |
|  | water | 240.0 |
|  | Component I | 60.96 |
|  | toluene | 17.6 |
| B | water | 21.81 |
|  | ferrous ammonium sulfate (1 wt. percent aqueous solution) | 0.32 |
|  | t-butylhydroperoxide | 0.16 |
| C | water | 18.2 |
|  | sodium metabisulfite | 0.2 |
| D | propylene glycol | 61.0 |

EXAMPLE 4

The procedure of Example 1 was followed except that the pre-emulsion was sonicated for 5 minutes instead of 10 and circulated 6 times instead of 8 with cooling water added to the external bath to maintain the pre-emulsion temperature from 20-27° C. and the materials listed below were used to produce a milky purple dispersion having a solids level of 33.81% and percent water of 3.60%.

| Charge | Material | Weight in grams |
|---|---|---|
| A | Component D | 11.88 |
|   | butylacrylate | 5.92 |
|   | dimethylethanolamine | 0.196 |
|   | water | 66.0 |
|   | Component I | 16.61 |
|   | toluene | 4.84 |
| B | water | 6.0 |
|   | ferrous ammonium sulfate (1 wt. percent aqueous solution) | 0.176 |
|   | t-butylhydroperoxide | 0.088 |
| C | water | 5.0 |
|   | sodium metabisulfite | 0.11 |
| D | propylene glycol | 28.2 |

EXAMPLE 5

The following materials were added in the order described as follows.

| Charge | Material | Weight in grams |
|---|---|---|
| A | Component F | 72.6 |
|   | dimethylethanolamine | 1.09 |
|   | butyl acrylate | 13.09 |
|   | Component K | 167.6 |
|   | toluene | 24.2 |
| B | water | 489.5 |
| C | water | 44.0 |
|   | ferrous ammonium sulfate | 0.009 |
|   | t-butylhydroperoxide | 0.44 |
| D | water | 71.5 |
|   | sodium metabisulfite | 0.55 |
| E | propylene glycol | 208.0 |

A pre-emulsion was prepared by adding Charge A into a Nalgene bottle followed by stirring and Charge B was added with stirring. This pre-emulsion was sonicated at room temperature for 5 minutes. The pre-emulsion was cycled six times through a Microfluidizer® M-110P at 12,000 psi. The Microfluidizer® M-110P is available from the Microfluidics™ division of MFIC Corporation, Newton, Mass. The resulting mixture was heated to 35° C. and the contents of Charge C was added with stirring. The contents of Charge D were added over 10 minutes. After the addition was complete the resulting mixture was heated to 55° C. for 30 minutes. Charge E was added and the resulting milky purple dispersion was transferred to a rotary evaporation flask operating at a maximum of 55° C. The resulting dispersion was evaporated until water was no longer collected and a constant weight was obtained. The solids was determined to be 36.0% and the percent water was 1.6.

EXAMPLE 6

The procedure of Example 5 was followed except that the materials listed below were used to produce a milky purple non-aqueous dispersion having a solids level of 35.5% and the percent water was 2.0.

| Charge | Material | Weight in grams |
|---|---|---|
| A | Component F | 72.6 |
|   | dimethylethanolamine | 1.09 |
|   | butyl acrylate | 13.09 |
|   | Component L | 143.6 |
|   | toluene | 24.2 |
| B | water | 500.5 |
| C | water | 44.0 |
|   | ferrous ammonium sulfate | 0.009 |
|   | t-butylhydroperoxide | 0.44 |
| D | water | 71.5 |
|   | sodium metabisulfite | 0.55 |
| E | propylene glycol | 209.0 |

EXAMPLE 7

The procedure of Example 5 was followed except that the materials listed below were used to produce a milky purple non-aqueous dispersion having a solids level of 36.0%.

| Charge | Material | Weight in grams |
|---|---|---|
| A | Component F | 16.55 |
|   | dimethylethanolamine | 0.25 |
|   | butyl acrylate | 2.78 |
|   | Component M | 34.52 |
|   | toluene | 5.5 |
| B | water | 110.0 |
| C | water | 10.0 |
|   | ferrous ammonium sulfate | 0.002 |
|   | t-butylhydroperoxide | 0.10 |
| D | deionized water | 16.3 |
|   | sodium metabisulfite | 0.125 |
| E | propylene glycol | 45.3 |

EXAMPLE 8

The procedure of Example 5 was followed except that the materials listed below were used to produce a milky purple non-aqueous dispersion having a solids level of 36.0%.

| Charge | Material | Weight in grams |
|---|---|---|
| A | Component F | 58.9 |
|   | dimethylethanolamine | 0.88 |
|   | butyl acrylate | 13.6 |
|   | Component N | 121.2 |
|   | toluene | 19.6 |
| B | water | 392.0 |
| C | water | 35.6 |
|   | ferrous ammonium sulfate | 0.0071 |
|   | t-butylhydroperoxide | 0.356 |
| D | water | 58.0 |
|   | sodium metabisulfite | 0.445 |
| E | propylene glycol | 175.0 |

EXAMPLE 9

The following materials were added in the order described.

| Charge | Material | Weight in grams |
|---|---|---|
| A | Component G | 32.16 |
| | butyl acrylate | 17.1 |
| | ethyleneglycol dimethacrylate | 3.6 |
| | dimethylethanolamine | 1.13 |
| | water | 132.0 |
| B | Component P | 35.2 |
| | methyl isobutylketone | 15.0 |
| | toluene | 19.6 |
| C | water | 10.0 |
| | ferrous ammonium sulfate (1 wt. percent aqueous solution) | 0.13 |
| | t-butylhydroperoxide | 0.1 |
| D | water | 10.0 |
| | sodium metabisulfite | 0.2 |
| E | propylene glycol | 101.5 |

A pre-emulsion was prepared by stirring Charge A in a glass beaker for 15 minutes. The pre-emulsion (155.0 grams) was added to the reservoir of the Microfluidizer® M-110P. After starting circulation Charge B was added. The resulting mixture was recirculated until the temperature of the mixture reached 60° C. then cooling water was turned on to reduce the temperature to 30° C. The recirculation was continued for 15 minutes. Charge C was added over 10 minutes followed by the addition of Charge D. The resulting milky purple dispersion was transferred to a rotary evaporation flask and Charge E was added. The resulting dispersion was evaporated until water was no longer collected and a constant weight was obtained. The solids level was determined to be 28.2%.

EXAMPLE 10

The procedure of Example 9 was followed except that 162.7 grams of Charge A was charged in the reservoir of the Microfluidizer and the following materials were used to produce a product having a solids level of 28.7%.

| Charge | Material | Weight in grams |
|---|---|---|
| A | Component G | 19.20 |
| | butyl acrylate | 16.44 |
| | ethyleneglycol dimethacrylate | 2.40 |
| | dimethylethanolamine | 0.72 |
| | water | 124.0 |
| B | Component Q | 18.91 |
| | methyl isobutylketone | 12.0 |
| C | water | 10.0 |
| | ferrous ammonium sulfate (1 wt. percent aqueous solution) | 0.16 |
| | t-butylhydroperoxide | 0.08 |
| D | water | 10.0 |
| | sodium metabisulfite | 0.1 |
| E | propylene glycol | 79.8 |

EXAMPLE 11

The procedure of Example 9 was followed except that 145.93 grams of Charge A was charged in the reservoir of the Microfluidizer and the following materials were used to produce a product having a solids level of 30.6%.

| Charge | Material | Weight in grams |
|---|---|---|
| A | Component G | 19.20 |
| | ethyleneglycol dimethacrylate | 2.01 |
| | dimethylethanolamine | 0.72 |
| | water | 124.0 |
| B | Component Q | 56.72 |
| | methyl isobutylketone | 12.0 |
| C | water | 10.0 |
| | ferrous ammonium sulfate (1 wt. percent aqueous solution) | 0.16 |
| | t-butylhydroperoxide | 0.08 |
| D | water | 10.0 |
| | sodium metabisulfite | 0.1 |
| E | propylene glycol | 79.8 |

EXAMPLE 12

The procedure of Example 5 was followed except that the materials listed below were used and Charge E was added to 144 grams of the product resulting from the addition of Charge D to produce a final product having a solids levels of 32.8%.

| Charge | Material | Weight in grams |
|---|---|---|
| A | Component J | 9.1 |
| | dimethylethanolamine | 0.31 |
| | butyl acrylate | 5.3 |
| | Component R | 14.9 |
| | toluene | 7.0 |
| B | water | 48.0 |
| C | water | 12.0 |
| | ferrous ammonium sulfate (1 wt. percent aqueous solution) | 0.07 |
| | t-butylhydroperoxide | 0.04 |
| D | water | 10 |
| | sodium metabisulfite | 0.04 |
| E | propylene glycol | 30.0 |

EXAMPLE 13

The procedure of Example 5 was followed except that the materials listed below were used and Charge E was added to 138 grams of the product resulting from the addition of Charge D to produce a final product having a solids levels of 34.1%.

| Charge | Material | Weight in grams |
|---|---|---|
| A | Component J | 9.1 |
| | dimethylethanolamine | 0.31 |
| | butyl acrylate | 5.3 |
| | Component S | 14.9 |
| | toluene | 7.0 |
| B | water | 48.0 |
| C | water | 12.0 |
| | ferrous ammonium sulfate | 0.07 |

-continued

| Charge | Material | Weight in grams |
|---|---|---|
|  | (1 wt. percent aqueous solution) |  |
|  | t-butylhydroperoxide | 0.04 |
| D | water | 10 |
|  | sodium metabisulfite | 0.04 |
| E | propylene glycol | 32.0 |

EXAMPLE 14

The procedure of Example 5 was followed except that the materials listed below were used and Charge E was added to 150 grams of the product resulting from the addition of Charge D to produce a final product having a solids level of 31.1%.

| Charge | Material | Weight in grams |
|---|---|---|
| A | Component J | 9.4 |
|  | dimethylethanolamine | 0.32 |
|  | butyl acrylate | 5.4 |
|  | Component R | 15.3 |
|  | toluene | 7.2 |
| B | water | 50.0 |
| C | water | 12.0 |
|  | ferrous ammonium sulfate (1 wt. percent aqueous solution) | 0.07 |
|  | t-butylhydroperoxide | 0.04 |
| D | water | 10.0 |
|  | sodium metabisulfite | 0.05 |
| E | propylene glycol | 32.0 |

COMPARATIVE EXAMPLE 1

The procedure of Example 5 was followed except that the materials listed below were used to produce a milky purple non-aqueous dispersion having a solids level of 30.0%.

| Charge | Material | Weight in grams |
|---|---|---|
| A | Component E | 15.9 |
|  | dimethylethanolamine | 0.47 |
|  | butyl acrylate | 8.0 |
|  | Component J | 21.5 |
|  | toluene | 5.5 |
| B | water | 115.0 |
| C | water | 10 |
|  | ferrous ammonium sulfate | 0.002 |
|  | t-butylhydroperoxide | 0.10 |
| D | water | 16.0 |
|  | sodium metabisulfite | 0.125 |
| E | propylene glycol | 52.5 |

COMPARATIVE EXAMPLE 2

The following materials were added in the order described.

| Charge | Material | Weight in grams |
|---|---|---|
| A | Component H | 46.26 |
|  | butyl acrylate | 10.18 |
|  | water | 45.12 |

| Charge | Material | Weight in grams |
|---|---|---|
| B | Component J | 22.45 |
|  | methyl isobutyl ketone | 16.0 |
| C | water | 30.0 |
| D | water | 12.1 |
|  | ferrous ammonium sulfate | 0.0013 |
|  | t-butylhydroperoxide (70 weight percent in water) | 0.06 |
| E | water | 10.0 |
|  | sodium metabisulfite | 0.08 |

A pre-emulsion was prepared by stirring Charge A in a glass beaker. The pre-emulsion (84.63 grams) was added to the reservoir of the Microfluidizer® M-110T. After starting circulation Charge B was added. The resulting mixture was recirculated for an additional 10 minutes. The resulting mixture was added to a suitably equipped reaction flask. Charge C was used to rinse the Microfluidizer and was added to the reaction flask. Charge D was added to the reaction mixture and followed by the addition of Charge E of a period of 10 minutes. During the addition of Charge E, the temperature of the reaction mixture rose from 19° C. to 23° C. The resulting milky purple dispersion was transferred to a rotary evaporation. The resulting dispersion was evaporated until solvent and water were removed and a constant weight was obtained. A total of 70 grams of the aqueous dispersion was recovered at a solids level of 39.7% and a pH of 7.88.

Section II—Preparation of Coating Compositions, Coated Lenses and Physical Testing Thereof Part A—Melamine Coating Formulations The following materials listed in gram quantities were added in the order listed to a one fluid ounce sized glass jar with sufficient mixing after each addition to homogeneously disperse the material. After completing the addition, each mixture was rolled for a minimum of 4 hours at the highest dial setting on a Wheaton Bench Top Roller at room temperature.

TABLE 1

Formulations of Examples 1A, 2A, 3A, 3B, 3C & 4A

| Materials | Ex. 1A | Ex. 2A | Ex. 3A | Ex. 3B | Ex. 3C | Ex. 4A |
|---|---|---|---|---|---|---|
| Charge A | | | | | | |
| Example 1 | 5.46 | | | | | |
| Example 2 | | 4.40 | | | | |
| Example 3 | | | 5.71 | 7.11 | 3.78 | |
| Example 4 | | | | | | 8.45 |
| Charge B | | | | | | |
| SIU9055.0[10] | 0.23 | 0.19 | 0.24 | 0.35 | 0.23 | 0.42 |
| Charge C | | | | | | |
| CYMEL® 327[11] resin | 1.77 | 1.46 | 1.39 | 2.66 | 2.00 | 3.05 |
| Charge D | | | | | | |
| TINUVIN® 292[12] | 0.06 | 0.05 | 0.06 | 0.08 | 0.04 | 0.09 |

[10]Reported to be a ureidopropyltriethoxysilane available from Gelest.
[11]Reported to be a melamine formaldehyde available from Cytec.
[12]Reported to be a hindered amine light stabilizer available from Ciba Specialty Chemicals.

Part B—Application of Coatings

PDQ® coated Gentex® polycarbonate plano lenses having a diameter of 76 millimeters were used as supplied. The lenses of Examples 1A, 2A, 3A, 3B, 3C & 4A were treated with oxygen plasma at a flow rate of 100 milliliters (mL) per minute of oxygen at 100 watts of power for one minute. The lenses were coated with the solutions of Examples 1A, 2A, 3A, 3B, 3C & 4A via a spin coating process. About 1-2 mL of the solution of each example was dispensed onto the lens and the lens rotated at 765 rpm for 8 seconds. The coated lenses were cured in a forced air oven via the following cure cycle: 80° C. for 5 minutes and 140° C. for 1 hour and cooled to room temperature. The coated lenses were treated with oxygen plasma as described and coated with HI-GARD®1080 coating solution, a commercially available solgel hardcoat producing coating solution from PPG Industries, Inc., via a spin coating process. About 1-2 mL of the HI-GARD 1080 was dispensed onto the lens and the lens rotated at 1067 rpm for 8 seconds. Subsequently, the lenses coated with HI-GARD®1080 coating solution were cured at 120° C. for 3 hours. An additional lens coated with Example 1A was not coated with the HI-GARD®1080 coating solution and was designated Example 1B and tested for resistance to caustic described hereinafter. The lenses of Examples 1A, 2A and 4A were submitted for photochromic testing as described in Section III.

Part C—Physical Testing

The coated lenses prepared in Part B were subjected to Primary Adhesion testing and Secondary Adhesion testing. Lenses coated with Examples 3C and 4A were tested for Haze and the lenses designated Example 1B were tested for resistance to caustic solutions.

The Primary and Secondary Adhesion Tests were conducted by using a procedure which is a modification of ASTM D-3539 Standard Test Method for Measuring Adhesion by Tape Test—Method B. The standard method was modified to include retesting of a different site on the same sample tested for Primary Adhesion after the sample was held in boiling water for 30 minutes after which the Secondary Adhesion Test was done. Results are reported as Percent Remaining after testing. The tape used was either 3M #600 clear tape or TESA 4651 tape. Results were that all of the lenses demonstrated 100 Percent Remaining.

The Haze Test was conducted on the lenses coated with Examples 3C and 4A. The haze of each lens was measured after being submerged in deionized boiling water for 30 minutes. The lenses were wiped dry and allowed to cool to room temperature before testing. Haze was measured using a Hunter Lab UltraScan XE instrument. The haze of lens coated with Example 3C was 0.92 and the haze of the lens coated with Example 4A was 25.9. A lower amount of haze indicated by a lower number is a desirable result.

The Caustic Test was conducted on a lens coated with the solution of Example 1B. The lens was submerged in caustic solution of 15% by weight of sodium hydroxide, 5% by weight Dowanol PM and 80% by weight deionized water that was heated in a sonic water bath to 60° C. Upon removal of the lens it was rinsed with deionized water and examined for any coating loss. Greater than 5.0 mm loss of coating from edge of lens was considered a failure. The lens coated with the solution of Example 1B passed the test.

Part D—Testing for Solvent Compatibility

The materials of Example 5 and Comparative Example 1 were tested for compatibility as determined by visual observation in a variety of solvents listed below. The materials of Example 5 (0.5 gram) and CE-1 (0.5 gram) were each added to a series of 20 mL glass vials. The different solvents listed below were individually added to the vials in 10 grams amounts. The results listed in Table 2 below were determined immediately after addition and were rated from 1 to 5 based on solubility. A rating of 1 corresponded to a very poorly soluble response, e.g., silver chloride in water, and a rating of 5 corresponded to soluble, i.e., completely miscible.

TABLE 2

Solvent Compatibility of Example 5 and Comparative Example 1

| SOLVENT | EXAMPLE 5 | CE-1 |
|---|---|---|
| 2-heptanone | 5 | 1 |
| Acetone | 3 | 1 |
| Ethyl acetate | 3 | 1 |
| Ethyl 3-ethoxypropionate | 5 | 1 |
| 1-methoxy-2-propanol | 5 | 5 |
| xylene | 1 | 1 |

Part E—Polyurethane Coating Formulations
Step 1—Preparation of an Acrylic Polyol
The following materials were added in the order described.

| Charge | Material | Weight in grams |
|---|---|---|
| A | DOWANOL® PM[13] | 584.01 |
| B | butyl Acrylate | 623.52 |
|   | hydroxyethyl acrylate | 952.98 |
|   | butyl methacrylate | 494.32 |
|   | methyl Methacrylate | 547.76 |
|   | acrylic Acid | 53.44 |
|   | tert-dodecyl mercaptan | 26.72 |
|   | triphenyl phosphite | 13.36 |
| C | tert-amylperoxy(ethylhexanoate) | 122.04 |
|   | DOWANOL® PM[13] | 104.8 |
| D | DOWANOL® PM[13] | 26.3 |
|   | di-tert-amyl peroxide | 26.3 |

[13]Reported to be a propylene glycol methyl ether available from the Dow Chemical Company.

Charge A was added to a 1 gallon, stainless-steel pressure reactor with stirring and the reactor was heated to 99° C. under atmospheric pressure. After reaching 99° C., the reactor was sealed and further heated to 165° C. Once the reactor had reached 165° C. at 39 psi, Charges B and C were added over a 3 hour interval. After completing the addition of Charges B and C and reaching 165° C. at 62 psi, Charge D was added over a period of 1 hour. The reactor temperature was maintained at 165° C. for 1 hour following the completion of Charge D at atmospheric pressure. The reaction mixture was cooled to 90° C. and poured through a 10 μm filter bag. The reaction yielded 3,500 grams of resin with a solids content of 78.5%.

Step 2—Preparation of Polyurethane Coating Compositions A and B
Coating Composition A
The following materials were added in the order described with mixing.

| Material | Weight in Grams |
|---|---|
| Example 8 | 14.9 |
| Example 6 | 13.9 |
| Example 7 | 6.2 |
| methyl amyl ketone | 9.9 |
| BYK®-333[14] | 0.02 |
| dibutyltindilaurate | 0.21 |
| Hindered Amine light Stabilizer (HALS-1)[15] | 0.62 |
| IRGANOX® 245[16] | 0.31 |
| gamma-glycidoxypropyltrimethoxysilane | 1.03 |

-continued

| Material | Weight in Grams |
|---|---|
| Product of Step 1 | 5.0 |
| TRIXENE ® BI-7950[17] | 7.8 |

[14]Reported to be a polyether modified polydimethylsiloxane available from BYK USA.
[15]HALS-1 is phenyl-(3,5-di-tert.butyl-4-hydroxy-benzyl)-malonic acid-bis-(1,2,2,6,6-tetra-methyl-4-piperidinyl)ester prepared as described U.S. Pat. No. 4,198,334 at column 14, line 59 to column 21, line 29, which disclosure is incorporated herein by reference.
[16]Reported to be a sterically-hindered, phenolic antioxidant available from Ciba Specialty Chemicals.
[17]Reported to be an IPDI type isocyanate blocked with 3,5-dimethylpyrazole available from Baxenden Chemicals Limited.

Coating Composition B

The following materials were added in the order described with mixing.

| Material | Weight in Grams |
|---|---|
| Example 12 | 25.0 |
| Example 13 | 47.3 |
| Example 14 | 63.0 |
| DOWANOL ® PM[13] | 86.9 |
| BYK ®-333[14] | 0.08 |
| dibutyltindilaurate | 1.0 |
| SILQUEST ® A1100[18] | 5.0 |
| Hindered Amine light Stabilizer (HALS-1)[15] | 23.4 |
| TRIXENE ® BI 7950[17] | 52.2 |

[18]Reported to be a gamma-ureidopropyltrialkoxysilane in methanol available from GE Silicones - OSi Specialties.

Part F—Application of Polyurethane Coatings

PDQ® coated Gentex® polycarbonate plano lenses having a diameter of 70 millimeters were used as supplied. The lenses to be coated with Coating Composition A containing Examples 6, 7 & 8 and the lenses to be coated with Coating Composition B containing Examples 12, 13 & 14 were subjected to corona treatment in a 3DT MultiDyne 1 system by placing each lens about 1 inch (2.54 cm) beneath the corona source rotating at about 200 rpm for about 3 to 4 seconds. The lenses were coated with the solutions of Coating Compositions A and B via a spin coating process. About 1-2 mL of the solution of each example was dispensed onto the lens and the lens rotated at 1,400 rpm for 5 seconds and then 2,000 rpm for 1 second. The coated lenses were cured in a forced air oven at 125° C. for 1 hour and cooled to room temperature. The lenses were submitted for photochromic testing as described in Section III.

Part G—Coating Compositions of UV-Curable Acrylics

The following materials were added in the order described

| | Materials | Example 9A Weight in grams | Example 9B Weight in grams |
|---|---|---|---|
| Charge A | SR9003[19] | 0.340 | 0.340 |
| | EBECRYL ® 8301-R[20] | 0.078 | 0.078 |
| | EBECRYL ® 8405[21] | 0.089 | 0.089 |
| | trimethylolpropane triacrylate | 0.060 | 0.060 |
| | bis(acyl)phosphine oxide | 0.002 | 0.002 |
| | diphenyl(2,4,6-trimethylbenzoyl)-phosphine oxide | 0.002 | 0.002 |
| | SIM 6500.0[22] | 0.030 | 0.030 |

-continued

| | Materials | Example 9A Weight in grams | Example 9B Weight in grams |
|---|---|---|---|
| Charge B | Example 9 | 2.82 | 2.82 |
| Charge C | PROGLYDE ® DMM[23] | 0.60 | |
| | NMP[24] | | 0.60 |

[19]Reported to be a propoxylated neopentyl glycol diacrylate available from SARTOMER.
[20]Reported to be a hexafunctional aliphatic urethane acrylate available from CYTEC Industries Inc.
[21]Reported to be a tetrafunctional aliphatic urethane acrylate available from CYTEC industries Inc.
[22]Reported to be a n-methylaminopropyltrimethoxysilane available from GELEST Inc.
[23]Reported to be a dipropylene glycol dimethyl ether available from Dow Chemical Inc.
[24]NMP is N-methylpyrrolidione (biotechnical grade) available from Aldrich Chemical.

Charge A was added to a suitable container equipped with a stirrer and mixed. Charge B was added and the resulting mixture was stirred for 2 to 5 minutes. Charge C was added and the mixture was heated to 60° C. and mixed until all materials dissolved. The stirring was stopped and the mixture was maintained at 60° C. for 30 to 60 minutes. After cooling to room temperature each of the coating solutions were used to coat lenses as described in Part H.

Part H—Coating Application

The lenses prepared in Part G were heated in a forced air oven at 80° C. oven for 15 minutes and then coated with the solutions of Examples 9A and 9B via a spin coating process. About 1-2 mL of the solution of each example was dispensed onto the lens and the lenses identified as 9A-1 and 9B-1 rotated at 1,400 rpm for 7 seconds and the lenses identified as 9A-2 and 9B-2 rotated at 1,400 rpm for 10 seconds. The coated lenses were cured in an EYE UV curing station with two V bulbs (160 W/m$^2$) at a speed of 5 ft/minute (152.4 cm/minute). After the lenses were cured, they were retreated with the corona source described in Part G whereupon a proprietary silane based Sol Gel hardcoat was applied to each of the lenses at a speed of 1,400 rpm for 12 seconds. The coated lenses were then cured in a forced air oven at 105° C. for 3 hours. The lenses were submitted for photochromic testing as described in Section III.

Part I—Preparation of Coating Compositions with a Commercial Sol-gel Product

The following materials listed in gram quantities were added in the order listed to a suitable container. After the addition of Charge B to Charge A the container was shaken for a minimum of 5 seconds to ensure that the coating solution was sufficiently mixed. Afterwards, the solution remained quiescent for a minimum of 10 minutes to allow any bubbles that formed to dissipate.

TABLE 3

Formulations of Coating Compositions 10A, 10B, CE-2A and CE-2B

| Materials | Ex. 10A | Ex. 10B | Ex. CE-2A | Ex. CE-2B |
|---|---|---|---|---|
| | Charge A | | | |
| HI-GARD ® 1080[25] | 90.0 | 50.0 | 90 | 52 |
| | Charge B | | | |
| Example 10 | 10.0 | 50.0 | | |
| Comparative Example 2 | | | 10.0 | 48.0 |

[25]Reported to be a sol-gel hardcoat solution available from PPG Industries, Inc.

Within minutes of making the coating solutions in Table 2, the coatings of Comparative Examples 2A and 2B flocculated. The coatings of Examples 10A and 10B were applied to lenses following the procedure of Part B—Application of Coatings except that prior to coating, the lenses were treated with oxygen plasma at 120 watts of power for 3 minutes instead of 100 watts for 1 minute; the lenses coated with the solution of Example 10A were coated at the spin speed of 463 rpm instead of 765 rpm; the coated lenses were dried at 80° C. for 10 minutes instead of 5 minutes; and a subsequent coating of HI-GARD® 1080 coating solution was not applied. The coated lenses were subjected to the Primary and Secondary Adhesion Tests described in Part C—Physical Testing. Results were that both sets of lenses demonstrated 100 Percent Remaining for both the Primary and Secondary Adhesion Tests. The lenses were submitted for photochromic testing as described in Section III.

Part J—Preparation of Coating Compositions with a Commercial Hi-index Sol-gel Product The procedure of Part I was followed using the materials listed in Table 4 to form the Coating Compositions of the Control (Part J) containing only the commercial product, 11A, 11B and 11C.

TABLE 4

Formulations of a Control and Examples 11A, 11B & 11C

| Materials | Control (Part J) | Ex. 11A | Ex. 11B | Ex. 11C |
|---|---|---|---|---|
| | Charge A | | | |
| HI-GARD® 1600LC[26] | 100.0 | 90.2 | 79.9 | 60.0 |
| | Charge B | | | |
| Example 11 | 0.0 | 9.8 | 20.1 | 40.0 |

[26]Reported to be a high index sol-gel hardcoat solution available from PPG Industries, Inc.

The procedure for applying the coating solution to the lenses described in Part J was followed except that the spin speeds were as follows: the Control (Part J) was 463 rpm; 11A was 493 rpm; 11B was 614 rpm; and 11C was 704 rpm. The solids content of Example 11, based on total weight of solids, in coating solution 11A was 10.7%; in 11B was 21.6%; and in 11C was 42.3%. The refractive index was measured for each of the coated lenses according to the Becke Test described in *Polarized Light Microscopy* by Walter C. McCrone et al on page 126, Tenth Printing, 1997, Copyright 1984 by McCrone Research Institute, 2820 South Michigan Avenue, Chicago, Ill. 60616-3292.

Abrasion resistance of the lenses coated with the solutions of the Control, 11A, 11B and 11C was determined using ASTM F735-81 Standard Test Method for Abrasion Resistance of Transparent Plastics and Coatings Using the Oscillating Sand Method. The test samples were exposed to 300 cycles of oscillation in the ASTM Test Method using 500 grams of alundum. The Bayer Abrasion Resistance Index (BARI), listed in Table 1 for single samples, was calculated by dividing the percent haze of an uncoated test sample made of a homopolymer prepared from CR-39® monomer by the percent haze of the coated test sample. The resulting number is an indication of how much more abrasion resistant the coated test sample is as compared to the uncoated test sample made of CR-39® monomer. The haze and transmission results before and after abrasion testing were measured with a BYK HAZEGARD® Plus instrument. The refractive indices and BARI results of the coated lenses are listed in Table 5.

TABLE 5

Refractive Indices and BARI of Lenses Coated with a Control, 11A, 11B & 11C

| Coating Identification | Refractive Index | BARI |
|---|---|---|
| Control (Part J) | 1.578 | 4.6 |
| 11A | 1.572 | 2.4 |
| 11B | 1.562 | 1.4 |
| 11C | 1.548 | 1.1 |

Part K—Preparation of Coating Compositions with a Commercial Sol-gel Products

The procedure of Part I was followed using the materials listed in Table 6 to form the Coating Compositions of the Control (Part K) containing only the commercial product, 10C, 10B, 10D, 10E, 10F, 10G, 10H, 10I.

TABLE 6

Formulations of Coating Compositions of Control (Part K), 10C, 10D, 10E, 10F, 10G, 10H & 10I

| Coating ID | Charge A HI-GARD® 1080[25] | Charge B Example 10 |
|---|---|---|
| Control (Part K) | 100.0 | 0.0 |
| 10C | 95.0 | 5.0 |
| 10D | 90.0 | 10.0 |
| 10E | 80.0 | 20.0 |
| 10F | 70.0 | 30.0 |
| 10G | 60.0 | 40.0 |
| 10H | 50.0 | 50.0 |
| 10I | 30.0 | 70.0 |

The procedure for applying the coating solution to the lenses described in Part J was followed except that the spin speeds were as listed in Table 7.

TABLE 7

Spin Speeds of Applied Coatings

| Coating ID | Spin Speed (rpm) |
|---|---|
| Control (Part K) | 1067 |
| 10C | 463 |
| 10D | 463 |
| 10E | 553 |
| 10F | 614 |
| 10G | 674 |
| 10H | 765 |
| 10I | 1187 |

The coated lenses were subjected to the Primary and Secondary Adhesion Tests described in Part C—Physical Testing. Results were that all of the lenses demonstrated 100 Percent Remaining for both the Primary and Secondary Adhesion Tests. The Bayer Abrasion Resistance Index was determined as described in Part J and the results as well as the initial Haze measurement are listed below in Table 8.

TABLE 8

BARI and Initial Haze Results

| Coating ID | Initial Haze | BARI |
|---|---|---|
| Control (Part K) | 0.15% | 5.2 |
| 10C | 0.14% | 3.1 |
| 10D | 0.16% | 2.5 |
| 10E | 0.14% | 1.8 |

TABLE 8-continued

BARI and Initial Haze Results

| Coating ID | Initial Haze | BARI |
|---|---|---|
| 10F | 0.16% | 1.6 |
| 10G | 0.15% | 1.4 |
| 10H | 0.14% | 1.2 |
| 10I | 0.17% | 0.9 |

Section III—Photochromic Performance Testing of the Coated Lenses

The photochromic performance of the coated lenses listed in Table 9 was determined as follows. The coated lenses prepared in Section II were tested for photochromic response on the Bench for Measuring Photochromics ("BMP") optical bench made by Essilor, Ltd. France. The optical bench was maintained at a constant temperature of 23° C. (73.4° F.) during testing.

Prior to testing on the optical bench, each of the coated lenses were exposed to 365-nanometer ultraviolet light for about 10 minutes at a distance of about 14 centimeters to activate the photochromic materials. The UVA (315 to 380 nm) irradiance at the lens was measured with a Licor Model Li-1800 spectroradiometer and found to be 22.2 watts per square meter. The lens was then placed under a 500 watt, high intensity halogen lamp for about 10 minutes at a distance of about 36 centimeters to bleach (inactivate) the photochromic materials. The illuminance at the lens was measured with the Licor spectroradiometer and found to be 21.4 Klux. The lenses were then kept in a dark environment at room temperature (from 21° C. to 24° C., or 70° F. to 75° F.) for at least 1 hour prior to testing on an optical bench. Prior to optical bench measurement, the lenses were measured for ultraviolet absorbance at 390 and 405 nm.

The BMP optical bench was fitted with two 150-watt ORIEL® Model #66057 Xenon arc lamps at right angles to each other. The light path from Lamp 1 was directed through a 3 mm SCHOTT® KG-2 band-pass filter and appropriate neutral density filters that contributed to the required UV and partial visible light irradiance level. The light path from Lamp 2 was directed through a 3 mm SCHOTT® KG-2 band-pass filter, a SCHOTT® short band 400 nm cutoff filter and appropriate neutral density filters in order to provide supplemental visible light illuminance. A 5.1 cm×5.1 cm (2 inch×2 inch) 50% polka dot beam splitter, at 45° to each lamp is used to mix the two beams. The combination of neutral density filters and voltage control of the Xenon arc lamp were used to adjust the intensity of the irradiance. Proprietary software was used on the BMP to control timing, irradiance, air cell and sample temperature, shuttering, filter selection and response measurement. A ZEISS® spectrophotometer, Model MCS 501, with fiber optic cables for light delivery through the lens was used for response and color measurement. Photopic response measurements were done for lenses containing the mixtures of photochromic materials in Compositions A and B, and response measurements at 565 to 570 nm were done for the remainder of the lenses which included Photochromic A.

The power output of the optical bench, i.e., the dosage of light that the lens was exposed to, was adjusted to 6.7 Watts per square meter (W/m$^2$) UVA, integrated from 315-380 nm and 50 Klux illuminance and integrated from 380-780 nm. Measurement of the power output was made using the optometer and software contained within the BMP.

Response measurements, in terms of a change in optical density ($\Delta$OD) from the unactivated or bleached state to the activated or colored state were determined by establishing the initial unactivated transmittance, opening the shutter from the Xenon lamp(s) and measuring the transmittance through activation at selected intervals of time. Change in optical density was determined according to the formula: $\Delta OD = \log_{10}(\% Tb/\% Ta)$, where % Tb is the percent transmittance in the bleached state, % Ta is the percent transmittance in the activated state.

The results of this testing are presented below in Table 9, wherein the absorbance of the coated lens at 390 nm as well as the First Fade Half Life ("T½") values, which are the time intervals in seconds for the $\Delta$OD of the activated form of the photochromic materials in the coatings to reach one half the fifteen-minute $\Delta$OD at 23° C. (73.4° F.), after removal of the activating light source. The Second Fade Half Life ("2T½") value is the time interval in seconds for the $\Delta$OD of the activated form of the photochromic material in the coating to reach one quarter the fifteen-minute $\Delta$OD at 23° C. (73.4° F.), after removal of the activating light source. The Third Half Life ("3T½") value is the time interval in second for $\Delta$OD of the activated form of the photochromic material in the coating to reach one-eighth the fifteen-minute $\Delta$OD at 23° C. (73.4° F.), after removal of the activating light source.

TABLE 9

Photochromic Response Results

| Lens # | Absorbance @ 390 nm | $\Delta$OD | First Half-life of fade (sec) | Second Half-life of fade (sec) | Third Half-life of fade (sec) |
|---|---|---|---|---|---|
| 1A | 1.43 | 0.76 | 44 | 106 | 301 |
| 2A | 1.34 | 0.75 | 42 | 97 | 218 |
| 4A | 1.39 | 0.74 | 43 | 100 | 225 |
| Composition A | 1.33 | 0.64 | 42 | 94 | 172 |
| Composition B | 0.84 | 0.48 | 56 | 135 | 260 |
| 9A-1 | 1.48 | 1.02 | 69 | 162 | 334 |
| 9A-2 | 1.42 | 0.99 | 70 | 166 | 339 |
| 9B-1 | 1.20 | 0.92 | 69 | 162 | 328 |
| 9B-2 | 1.12 | 0.88 | 69 | 166 | 328 |
| 10A | 0.058 | 0.10 | 61 | 138 | 286 |
| 10B | 0.25 | 0.66 | 56 | 131 | 260 |

The present invention has been described with reference to specific details of particular embodiments thereof. It is not intended that such details be regarded as limitations upon the scope of the invention except insofar as to the extent that they are included in the accompanying claims.

What is claimed is:

1. A non-aqueous dispersion of photosensitive polymeric microparticles, comprising:
    a) an organic continuous phase comprising an organic solvent; and
    b) photosensitive polymeric microparticles dispersed in the organic continuous phase, wherein the microparticles comprise an at least partially polymerized component having integral surface and interior domains, wherein the surface domain comprises a polymeric material that is solubilized by the organic solvent, the interior domain comprises a polymeric material that is insoluble in the organic solvent, and the surface domain and/or interior domain is photosensitive.

2. The non-aqueous dispersion of claim 1 wherein the organic solvent is a polar solvent comprising an alcohol, diol, glycol, ether, amide, nitrile, ester, ketone, and/or lactam.

3. The non-aqueous dispersion of claim 1 wherein the photosensitive material is substantially non-extractable from the photosensitive polymeric microparticles.

4. The non-aqueous dispersion of claim 1 wherein the photosensitive polymeric microparticles are magnetic, magnetically responsive, electrically conductive, dichroic, chromatic and/or chemically reactive with a crosslinking material.

5. The non-aqueous dispersion of claim 1, further comprising a nanopigment and/or non-photosensitive dye.

6. A curable, photosensitive film-forming composition prepared from:
   (a) a film-forming component comprising at least one material having reactive functional groups; and
   (b) a non-aqueous dispersion of photosensitive polymeric microparticles, comprising:
   i) an organic continuous phase comprising an organic solvent; and
   ii) photosensitive polymeric microparticles dispersed in the organic continuous phase, wherein the microparticles comprise an at least partially polymerized component having integral surface and interior domains, wherein the surface domain comprises at least one substantially hydrophilic region, the interior domain comprises at least one substantially hydrophobic region, and the surface and/or interior domain is photosensitive.

7. The film-forming composition of claim 6, wherein the film-forming component (a) comprises an alkoxide of the general formula $R_xM(OR')_{z-x}$ where R is an organic radical, M is silicon, aluminum, titanium, and/or zirconium, each R' is independently an alkyl radical, z is the valence of M, and x is a number less than z.

8. The film-forming composition of claim 6 wherein the organic solvent is a polar solvent comprising an alcohol, diol, glycol, ether, amide, nitrile, ester, ketone, and/or lactam.

9. A substrate coated with the curable film-forming composition of claim 6.

10. The coated substrate of claim 9 wherein the substrate is an ophthalmic element selected from the group consisting of corrective lenses, non-corrective lenses, contact lenses, intraocular lenses, magnifying lenses, protective lenses and visors, and wherein after curing, the film-forming composition demonstrates a refractive index greater than 1.5.

11. The film-forming composition of claim 6, wherein the material having reactive functional groups in the film-forming component (a) comprises an aminoplast, a capped or free polyisocyanate, and/or an ethylenically unsaturated compound.

12. The film-forming composition of claim 11, wherein the material having reactive functional groups in the film-forming component (a) comprises an aminoplast, and wherein the substantially hydrophilic region of the surface domain of the microparticles is prepared from an isocyanurate.

13. The film-forming composition of claim 6, wherein the photosensitive polymeric microparticles contain functional groups that are reactive with the reactive functional groups in the material in film-forming component (a).

14. The film-forming composition of claim 6, wherein the photosensitive polymeric microparticles are photochromic.

* * * * *